(12) United States Patent
Kitamura et al.

(10) Patent No.: US 12,232,297 B2
(45) Date of Patent: Feb. 18, 2025

(54) COOLING DEVICE

(71) Applicant: Nidec Corporation, Kyoto (JP)

(72) Inventors: Yoshihisa Kitamura, Kyoto (JP); Naoyuki Takashima, Kyoto (JP); Takehito Tamaoka, Kyoto (JP); Toshihiko Tokeshi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 207 days.

(21) Appl. No.: 18/100,581

(22) Filed: Jan. 24, 2023

(65) Prior Publication Data

US 2023/0247792 A1    Aug. 3, 2023

(30) Foreign Application Priority Data

Jan. 31, 2022 (JP) .................................. 2022-013794
Mar. 11, 2022 (JP) .................................. 2022-038527

(51) Int. Cl.
    *H05K 7/20* (2006.01)
(52) U.S. Cl.
    CPC ..... *H05K 7/20272* (2013.01); *H05K 7/20254* (2013.01)
(58) Field of Classification Search
    None
    See application file for complete search history.

(56) References Cited

U.S. PATENT DOCUMENTS

| 11,252,837 | B2 * | 2/2022 | Nakae | F28D 1/05366 |
| 2007/0070600 | A1 * | 3/2007 | Tomioka | F28D 15/0266 |
| | | | | 361/688 |
| 2019/0307019 | A1 * | 10/2019 | Nakae | H05K 7/20254 |
| 2020/0137929 | A1 * | 4/2020 | Tokeshi | H05K 7/20927 |
| 2021/0127526 | A1 | 4/2021 | Chen et al. | |
| 2022/0057124 | A1 * | 2/2022 | Kitamura | F04B 53/10 |
| 2022/0287204 | A1 * | 9/2022 | Takashima | H05K 7/20272 |

\* cited by examiner

*Primary Examiner* — Xanthia C Relford
(74) *Attorney, Agent, or Firm* — Keating & Bennett, LLP

(57) ABSTRACT

A cooling device includes a first cooling section, a second cooling section, a first pump section, a second pump section, a branch section, a first flow path section, a second flow path section, a merging section, and a connection section. The branch section branches a refrigerant into two. The first flow path section connects the first cooling section and the first pump section, and one portion of the refrigerant passes through the first flow path section. The second flow path section connects the second cooling section and the second pump section, and another portion of the refrigerant passes through the second flow path section. The merging section merges the refrigerant having passed through each of the first flow path section and the second flow path section. The connection section connects the first and second flow path sections between the branch section and the merging section.

12 Claims, 19 Drawing Sheets

COOLING DEVICE

CROSS-REFERENCE TO RELATED APPLICATIONS

The present application claims priority under 35 U.S.C. § 119 to Japanese Patent Application No. 2022-013794, filed on Jan. 31, 2022 and Japanese Patent Application No. 2022-038527, filed on Mar. 11, 2022, the entire contents of which are hereby incorporated herein by reference.

1. Field of the Invention

The present disclosure relates to a cooling device.

2. Background

A conventional cold plate includes a work space in which heat exchange is performed by a fluid and a pump configured to guide the fluid to an outlet passage discharged from the work space. The work space includes a base configured to absorb thermal energy and transfer the thermal energy to the fluid, and a casing.

In the conventional cold plate, when the pump is stopped, the fluid cannot be discharged from the work space and the heat exchange cannot be continued in the cold plate where the pump is stopped.

SUMMARY

A cooling device according to an example embodiment of the present disclosure includes a first cooling section, a second cooling section, a first pump section, a second pump section, a branch section, a first flow path section, a second flow path section, a merging section, and a connection section. The branch section branches a refrigerant into two. The first flow path section connects the first cooling section and the first pump section, and one portion of the refrigerant having been branched passes through the first flow path section. The second flow path section connects the second cooling section and the second pump section, and another portion of the refrigerant having been branched passes through the second flow path section. The merging section merges the refrigerant that has passed through the first flow path section and the second flow path section. The connection section fluidly connects the first flow path section and the second flow path section between the branch section and the merging section.

The above and other elements, features, steps, characteristics and advantages of the present disclosure will become more apparent from the following detailed description of the example embodiments with reference to the attached drawings.

DETAILED DESCRIPTION

Figure 1:
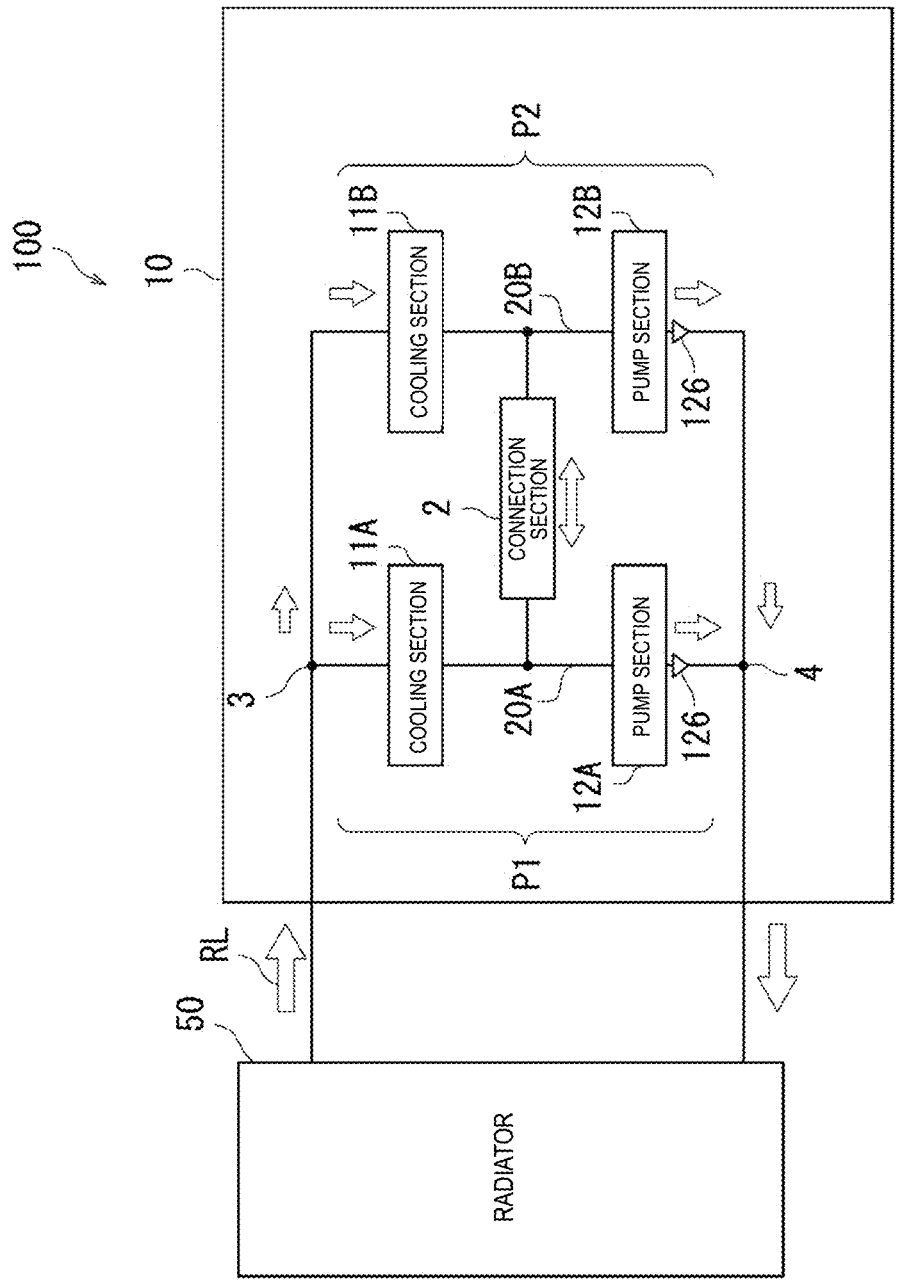
FIG. 1 is a view showing an outline of a cooling system according to a preferred embodiment of the present invention.

Example embodiments of the present disclosure will be described hereinafter with reference to the drawings. In the drawings, the same or corresponding components are denoted by the same reference signs and description thereof will not be repeated. In the following description, a first direction X, a second direction Y, and a third direction Z that are orthogonal to one another are described as appropriate for ease of understanding. One side in the first direction X is referred to as the first direction one side X1, and the other side in the first direction X is referred to as first direction other side X2. One side in the second direction Y is referred to as second direction one side Y1, and the other side in the second direction Y is referred to as second direction other side Y2. One side in the third direction Z is referred to as third direction one side Z1, and the other side in the third direction Z is referred to as third direction other side Z2. However, the direction is defined merely for convenience of description, and the orientation at the time of use of the cooling device according to the present disclosure is not limited unless it is particularly necessary to define the horizontal direction and the vertical direction. An "orthogonal direction" in the present application includes a substantially orthogonal direction.

With reference to FIG. 1, a cooling system 100 including a cooling device 10 of an example embodiment will be described. FIG. 1 is a view showing an outline of the cooling system 100.

The cooling system 100 includes the cooling device 10 and a heat exchanger 50. The heat exchanger 50 is connected to the cooling device 10. The cooling system 100 and the cooling device 10 are used for cooling of a heat generating component C1. A refrigerant RL for cooling the heat generating component C1 passes through the heat exchanger 50 and the cooling device 10. The refrigerant RL is, for example, liquid or gas. The heat generating component C1 is, for example, electronic equipment such as a central processing unit (CPU). The heat generating component C1 is not limited to electronic equipment.

The cooling device 10 includes two cooling sections 11A and 11B, two pump sections 12A and 12B, two flow path sections 20A and 20B, a connection section 2, a branch section 3, and a merging section 4. The cooling section 11A is an example of the first cooling section. The cooling section 11B is an example of the second cooling section. The pump section 12A is an example of the first pump section. The pump section 12B is an example of the second pump section. The flow path section 20A is an example of the first flow path section. The flow path section 20B is an example of the second flow path section. In the present description, there are cases where each of the cooling section 11A and the cooling section 11B is referred to as the cooling section 11, each of the pump section 12A and the pump section 12B is referred to as pump section 12, and each of the flow path section 20A and the flow path section 20B is referred to as flow path section 20.

The cooling section 11 cools the heat generating component C1. The pump section 12 sucks the refrigerant RL and discharges the refrigerant RL. The flow path section 20 connects the cooling section 11 and the pump section 12. Specifically, the flow path section 20A connects the cooling section 11A and the pump section 12A. The flow path section 20B connects the cooling section 11B and the pump section 12B.

By suction and discharge of the refrigerant RL by the pump section 12, the refrigerant RL passes through the cooling section 11 and the flow path section 20B. In the cooling section 11, the heat generating component C1 is cooled by the refrigerant RL. As a result, for example, the temperature of the refrigerant RL rises.

The branch section 3 branches the refrigerant RL into a first path P1 and a second path P2. The first path P1 includes the cooling section 11A, the pump section 12A, and the flow path section 20A. The second path P2 includes the cooling section 11B, the pump section 12B, and the flow path section 20B. One portion of the refrigerants RL branched by the branch section 3 passes through the first path P1. The other of the refrigerants RL branched by the branch section 3 passes through the second path P2. That is, the first path P1 and the second path P2 are arranged in parallel.

The merging section 4 merges the refrigerants RL that have passed through the first path P1 and the second path P2. The refrigerant RL merged by the merging section 4 reaches the branch section 3 through the heat exchanger 50. When passing through the heat exchanger 50, the refrigerant RL is cooled. As described above, the refrigerant RL circulates through the heat exchanger 50 and the cooling device 10 in the cooling system 100.

The connection section 2 fluidly connects the flow path section 20A and the flow path section 20B in a section from the branch section 3 to the merging section 4. Specifically, the connection section 2 connects the flow path section 20A and the flow path section 20B such that the refrigerant RL can flow therebetween. For example, the connection section 2 can supply the refrigerant RL passing through the flow path section 20A to the flow path section 20B, and can supply the refrigerant RL passing through the flow path section 20B to the flow path section 20A. That is, the connection section 2 is a bypass flow path that connects the flow path section 20A and the flow path section 20B.

For example, when the pump section 12A is driven and the pump section 12B is stopped, the refrigerant RL passing through the second path P2 is supplied to the flow path section 20A via the connection section 2 by suction and discharge of the refrigerant RL by the pump section 12A. On the other hand, when the pump section 12B is driven and the pump section 12A is stopped, the refrigerant RL passing through the first path P1 is supplied to the flow path section 20B via the connection section 2 by suction and discharge of the refrigerant RL by the pump section 12B. As a result, even when the pump section 12 in one cooling assembly 1 is stopped, the pump section 12 in the other cooling assembly 1 is driven, so that the refrigerant RL can be supplied to the cooling section 11 in one cooling assembly 1 via the connection section 2, and the circulation of the refrigerant RL in the cooling system 100 can be continued. That is, the cooling system 100 including redundancy can be constructed.

Figure 2:
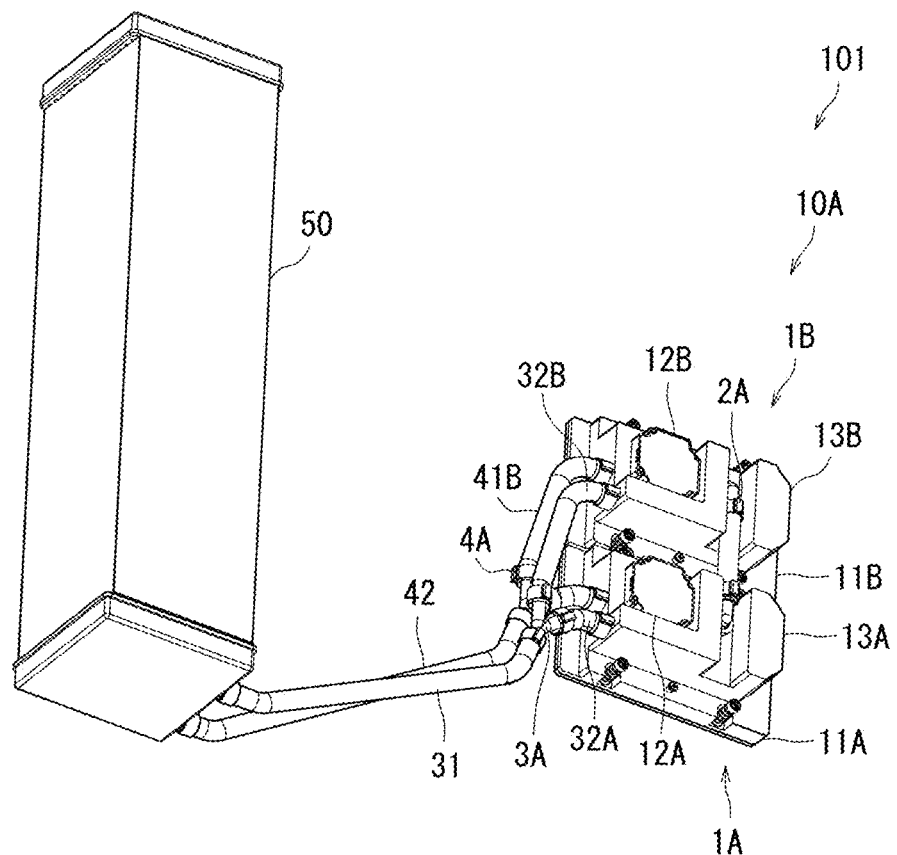
FIG. 2 is a view showing a detailed configuration of the cooling system.

Next, a specific example of a cooling system of an example embodiment is described with reference to FIG. 2. FIG. 2 is a view showing a detailed configuration of a cooling system 101. The cooling system 101 is an example of a specific example of the cooling system 100 shown in FIG. 1.

The cooling system 101 includes a cooling device 10A, a pipe 31, a pipe 42, and the heat exchanger 50. The heat exchanger 50 is connected to the cooling device 10A via the pipe 31 and the pipe 42. The refrigerant RL for cooling the heat generating component C1 passes through inside the heat exchanger 50, the pipe 31, the pipe 42, and the cooling device 10A. For example, the refrigerant RL passes through the heat exchanger 50, the pipe 31, the cooling device 10A, and the pipe 42 in this order, and returns to the heat exchanger 50.

The heat exchanger 50 cools the refrigerant RL. For example, the heat exchanger 50 is a radiator that radiates heat to the outside when the refrigerant RL having heat passes therethrough. The heat exchanger 50 includes a plurality of refrigerant pipes extending along the third direction Z inside the heat exchanger 50 and a plurality of fins. The refrigerant RL passes through inside the refrigerant pipes. The plurality of fins are arranged around the refrigerant pipes. A part of each of the fins is in contact with the refrigerant pipe. More specifically, the fin and the refrigerant pipe are joined by welding or the like. The fins absorb heat of the refrigerant pipes and the refrigerant RL and radiate the heat to the outside air, thereby lowering the temperature of the refrigerant RL. However, the heat exchanger 50 is not limited to a radiator that radiates heat to the outside. For example, heat exchange may be performed to a flow path through which a refrigerant other than the refrigerant RL flows.

Figure 3:
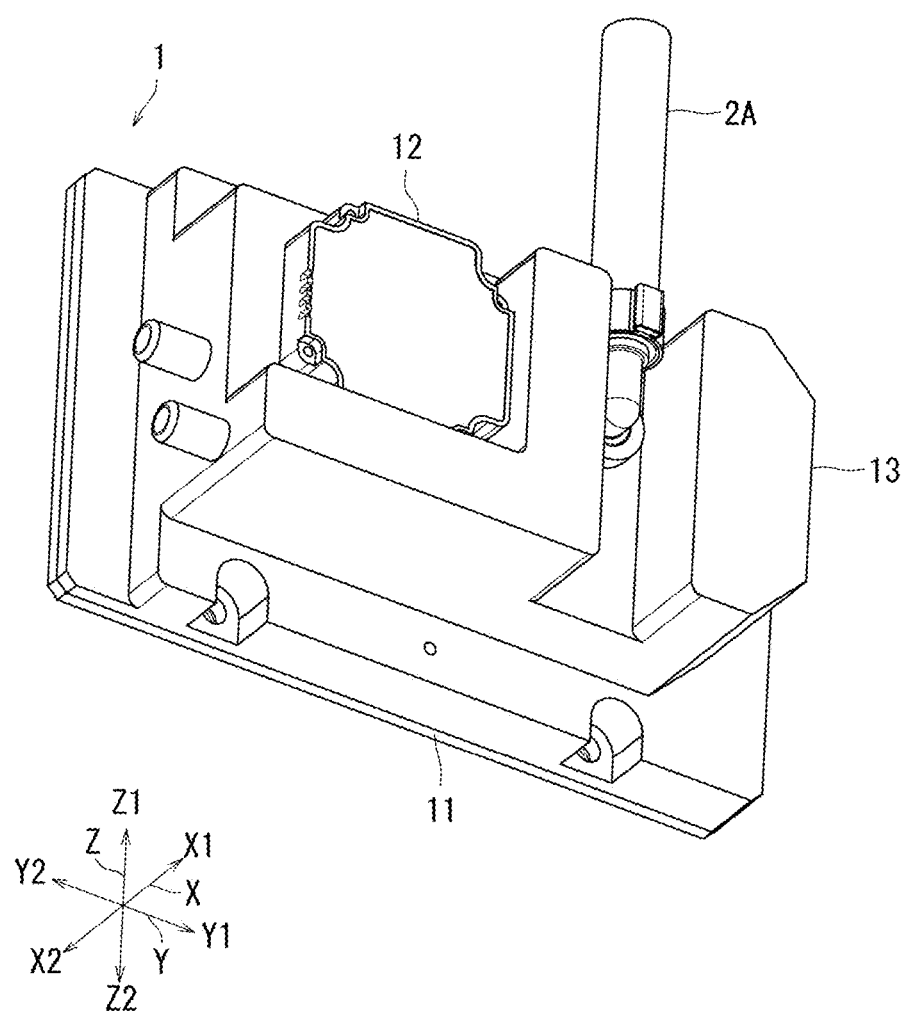
FIG. 3 is a perspective view showing a cooling assembly according to a preferred embodiment of the present invention.

Next, the cooling device 10A and the cooling assembly 1 will be described with reference to FIGS. 2 and 3. FIG. 3 is a perspective view showing the cooling assembly 1.

The cooling device 10A includes two cooling assemblies 1A and 1B, a connection section 2A, a branch section 3A, and a merging section 4A. The cooling assembly 1A and the cooling assembly 1B each cool the heat generating component C1. In the present description, each of the cooling assembly 1A and the cooling assembly 1B may be referred to as cooling assembly 1. The cooling assembly 1A is an example of the first path P1. The cooling assembly 1B is an example of the second path P2.

The pipe 31 connects one end of the refrigerant pipe of the heat exchanger 50 and the branch section 3A of the cooling device 10A. A pipe 32A and a pipe 32B are further connected to the branch section 3A. The pipe 32A connects the branch section 3A and the cooling assembly 1A. The pipe 32B connects the branch section 3A and the cooling assembly 1B. The refrigerant RL having passed through the heat exchanger 50 passes through the pipe 31, the pipe 32A, and the pipe 32B. The branch section 3A causes the refrigerant RL having passed through the pipe 31 to pass through the pipe 32A and the pipe 32B in a branched manner.

As shown in FIGS. 2 and 3, the cooling assembly 1 includes the cooling section 11, the pump section 12, and an accommodation section 13. The accommodation section 13 connects the cooling section 11 and the pump section 12. The accommodation section 13 includes the flow path section 20. The accommodation section 13 is, for example, a box-shaped housing. The accommodation section 13 is made of, for example, resin. In the present example embodiment, the cooling assembly 1A includes the cooling section 11A, the pump section 12A, and an accommodation section 13A. The cooling assembly 1B includes the cooling section 11B, the pump section 12B, and an accommodation section 13B.

The refrigerant RL having passed through the pipe 32A reaches the cooling assembly 1A and passes through inside the cooling assembly 1A. The refrigerant RL having passed through the pipe 32B reaches the cooling assembly 1B and passes through inside the cooling assembly 1B. Details of the inside of the cooling assembly 1 will be described later.

A pipe 41A is further connected to the cooling assembly 1A. A pipe 41B is further connected to the cooling assembly 1B. The refrigerant RL having passed through the cooling assembly 1A passes through the pipe 41A. The refrigerant RL having passed through the cooling assembly 1B passes through the pipe 41B. The pipe 41A and the pipe 41B are connected to the merging section 4A. A pipe 42 is further connected to the merging section 4A. The merging section 4A merges the refrigerant RL having passed through the pipe 41A and the refrigerant RL having passed through the pipe 41B to pass through the pipe 42.

The pipe 42 connects the merging section 4A and the other end of the refrigerant pipe of the heat exchanger 50. The refrigerant RL having passed through the pipe 42 reaches the heat exchanger 50 and passes through inside the refrigerant pipe of the heat exchanger 50.

Figure 4:
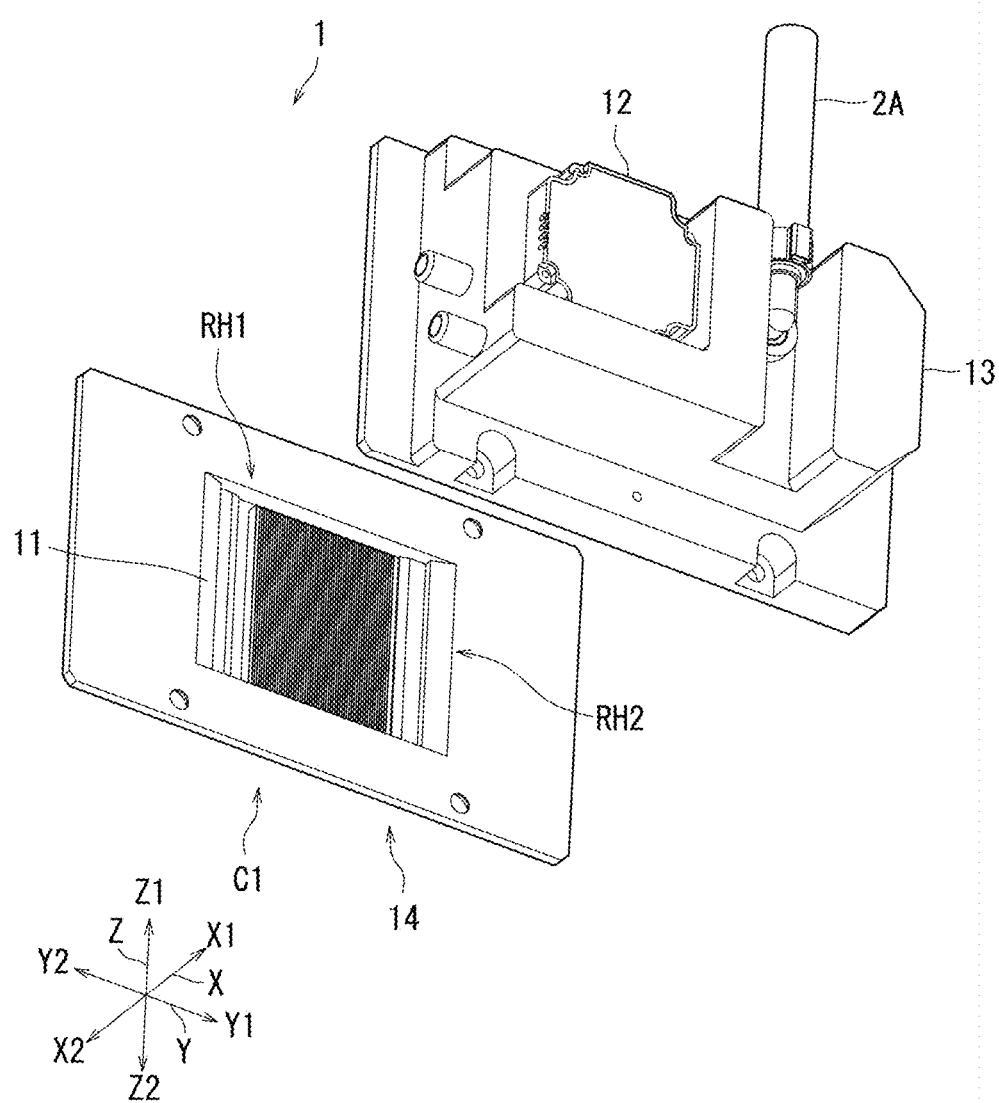
FIG. 4 is a schematic perspective view showing inside of the cooling assembly.
Figure 5:
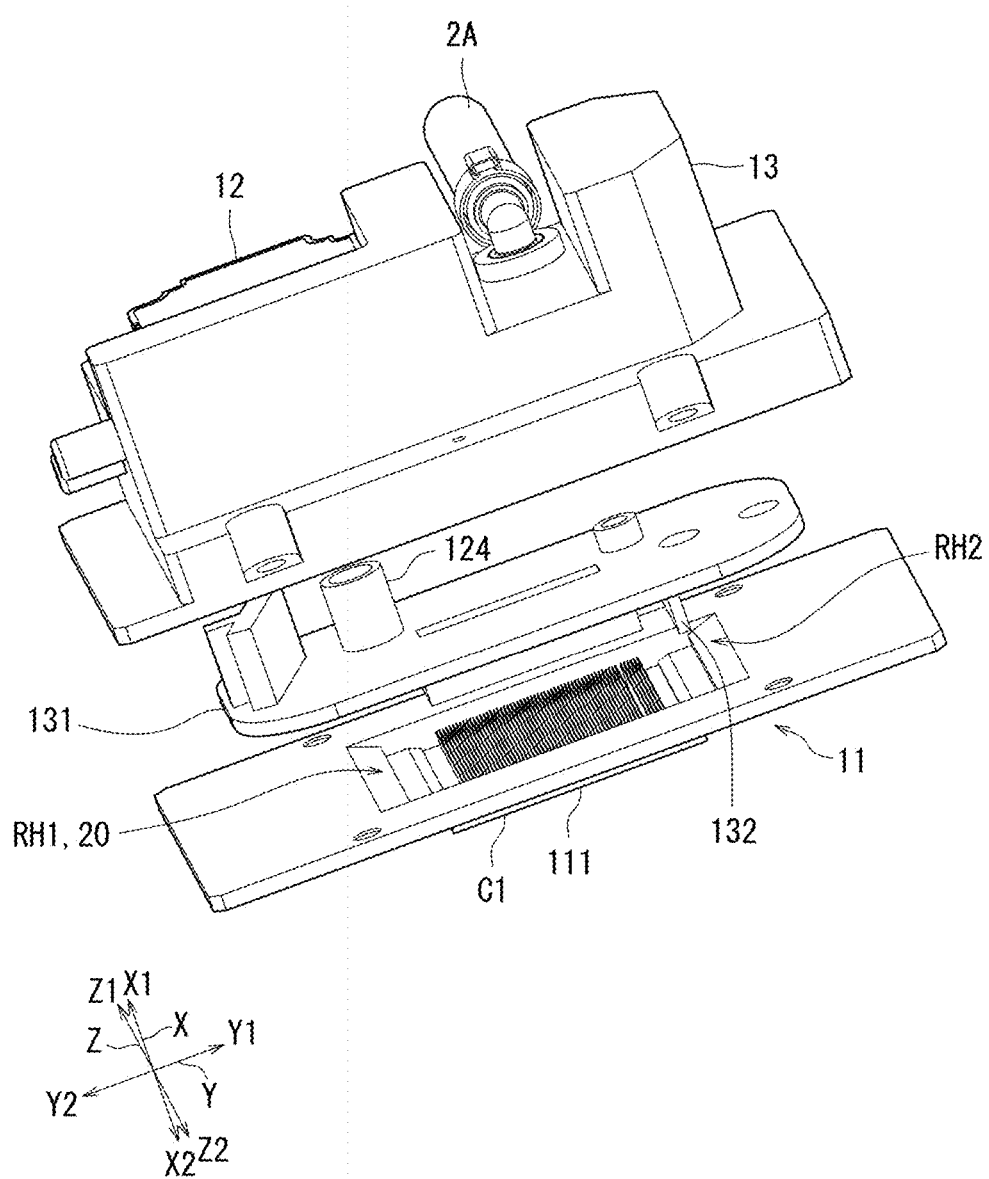
FIG. 5 is a schematic perspective view showing inside of the cooling assembly.
Figure 6A:
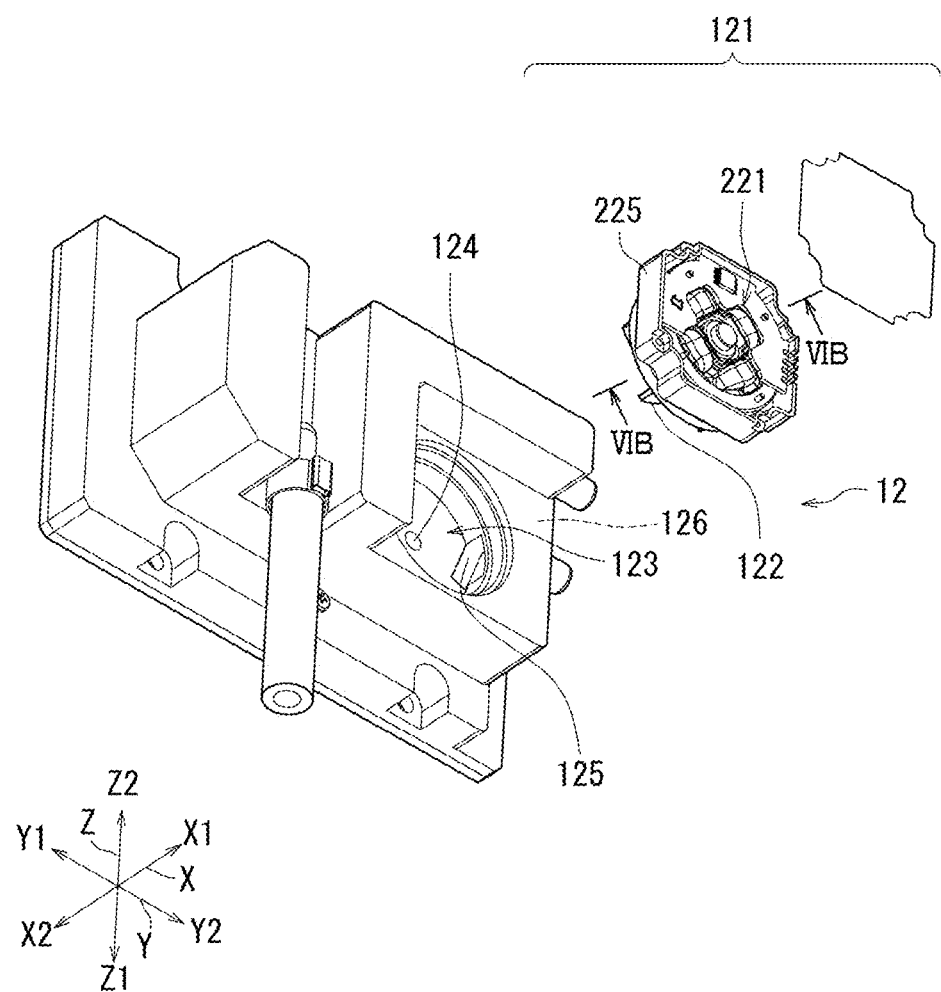
FIG. 6A is a schematic perspective view showing inside of the pump section.
Figure 6B:
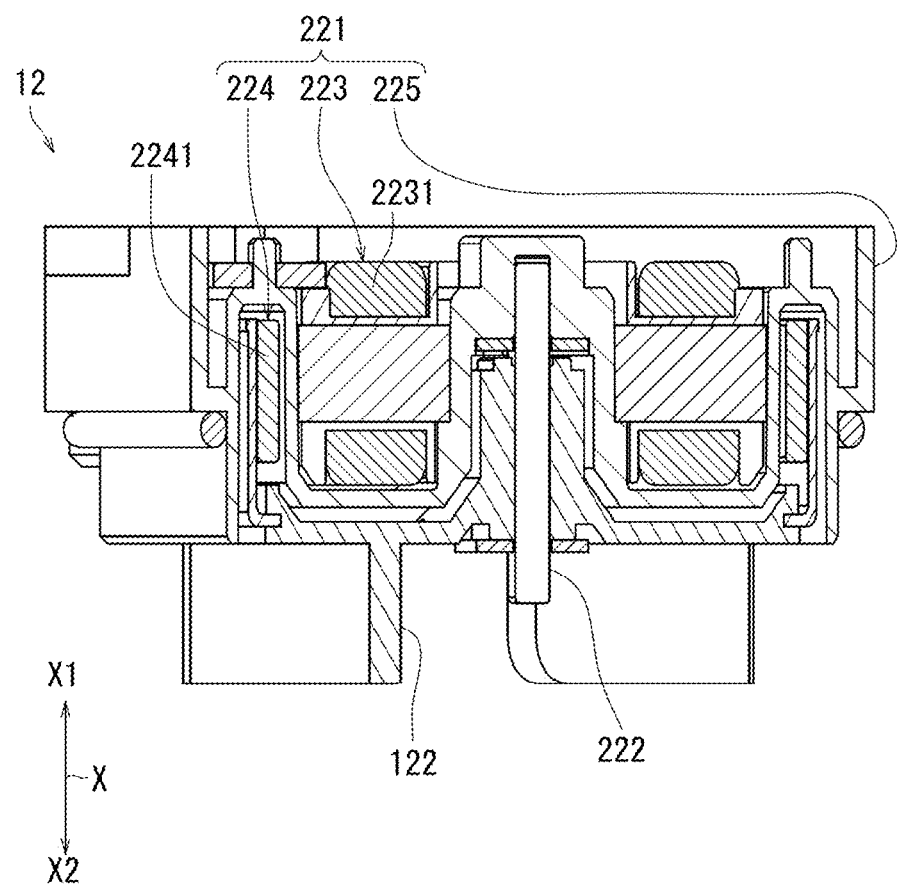
FIG. 6B is a sectional view taken along line VIB-VIB of FIG. 6A.

Next, details of the cooling assembly 1 will be described with reference to FIGS. 3 to 6B. FIGS. 4 and 5 are schematic perspective views showing the inside of the cooling assembly 1. FIG. 6A is a schematic perspective view showing the inside of the pump section 12. FIG. 6B is a sectional view taken along line VIB-VIB of FIG. 6A.

As shown in FIGS. 4 and 5, the cooling section 11 includes a contact section 111 and a first heat exchange chamber RH1. The contact section 111 is in contact with the heat generating component C1. The accommodation section 13 includes a partition section 131. The partition section 131 partitions the pump section 12 and the cooling section 11. That is, the pump section 12 and the cooling section 11 are positioned on opposite sides across the partition section 131. Specifically, the partition section 131 is positioned on the first direction other side X2 of the pump section 12 and on the first direction one side X1 of the first heat exchange chamber RH1. The contact section 111 is positioned on the first direction other side X2 of the first heat exchange chamber RH1. For example, the contact section 111 is positioned on a surface facing the first direction other side X2 outside the first heat exchange chamber RH1. The heat generating component C1 is disposed in the contact section 111.

For example, in the cooling assembly 1A, the refrigerant RL flows into the first heat exchange chamber RH1 in the cooling section 11A from the pipe 32A. Details of the flow path from the pipe 32A to the first heat exchange chamber RH1 will be described later. Hereinafter, since the configuration of the cooling assembly 1B is the same as the configuration of the cooling assembly 1A, the description will be omitted.

The refrigerant RL having flowed into the first heat exchange chamber RH1 flows into the pump section 12 through inside the first heat exchange chamber RH1. Specifically, the refrigerant RL flows into a pump chamber 123 shown in FIG. 6A via a pump inflow path 124 shown in FIG. 6A. The pump inflow path 124 penetrates the partition section 131 to connect the first heat exchange chamber RH1 and the pump chamber 123 shown in FIG. 6A. In the cooling assembly 1A, the pump inflow path 124 is an example of a first pump inflow path, and the pump chamber 123 is an example of a first pump chamber. In the cooling assembly 1B, the pump inflow path 124 is an example of a second pump inflow path, and the pump chamber 123 is an example of a second pump chamber.

The connection section 2A connects the first heat exchange chamber RH1 in the cooling assembly 1A and the first heat exchange chamber RH1 in the cooling assembly 1B. In the present example embodiment, the first heat exchange chamber RH1 corresponds to the flow path section 20. Therefore, the refrigerant RL passing through the first heat exchange chamber RH1 in the cooling assembly 1A can be supplied to the first heat exchange chamber RH1 in the cooling assembly 1B by the connection section 2A. The refrigerant RL passing through the first heat exchange chamber RH1 in the cooling assembly 1B can be supplied to the first heat exchange chamber RH1 in the cooling assembly 1A by the connection section 2A.

As described above, it is possible to make the cooling assembly 1 compact by accommodating the pump section 12 and the cooling section 11 in one accommodation section 13. By arranging the two cooling assemblies 1 in parallel and connecting the two cooling assemblies 1 by the connection section 2A, it is possible to continue cooling of the heat generating component C1 by supplying the refrigerant RL from the other cooling assembly 1 to the cooling section 11 in one cooling assembly 1 where the pump section 12 is stopped. If the two conventional cold plates are arranged in parallel, the two cold plates are not connected, and therefore discharge of a fluid is stopped in the cold plate where the pump is stopped, and heat exchange can no longer be continued.

Figure 6C:
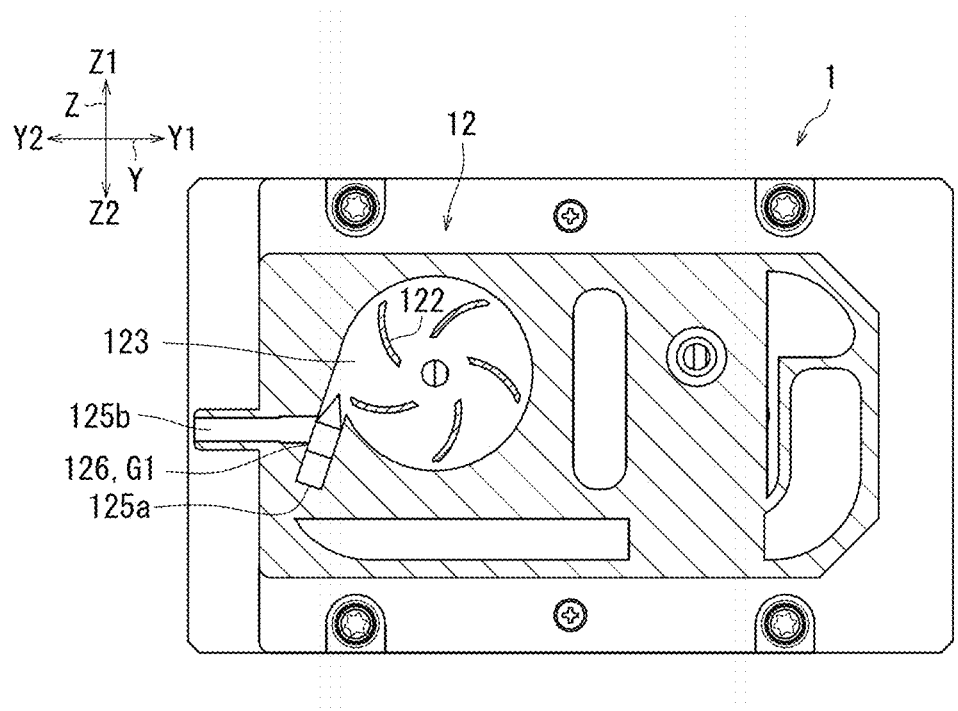
FIG. 6C is a sectional view showing inside of a pump section 12.

Next, details of the pump section 12 will be described with reference to FIGS. 6A and 6B. As shown in FIG. 6A, the pump section 12 includes a pump 121, the pump chamber 123, the pump inflow path 124, a pump outflow path 125, and a check valve 126 (FIG. 6C). The pump section 12 is an example of the first pump section in the cooling assembly 1A, and is an example of the second pump section in the cooling assembly 1B. The pump 121 is an example of a first pump in the cooling assembly 1A, and is an example of a second pump in the cooling assembly 1B. The pump outflow path 125 is an example of a first pump outflow path in the cooling assembly 1A, and is an example of a second pump outflow path in the cooling assembly 1B. The check valve 126 is an example of a first check valve in the cooling assembly 1A, and is an example of a second check valve in the cooling assembly 1B.

The pump 121 is disposed in the pump chamber 123. The pump 121 sucks the refrigerant RL and discharges the refrigerant RL to circulate the refrigerant RL in the cooling system 101. The pump 121 includes an impeller 122 and a motor 221. As shown in FIG. 6B, the pump 121 includes a rotating shaft 222. The motor 221 rotates the rotating shaft 222. The rotating shaft 222 couples the motor 221 and the impeller 122. The rotating shaft 222 is positioned at the center of the surface on the first direction other side X2 of the pump chamber 123. The pump inflow path 124 is positioned at the center of the surface on the first direction other side X2 of the pump chamber 123.

Specifically, the motor 221 includes a stator 223, a rotor 224, and a casing 225 that covers the first direction one side X1 of the pump chamber 123. The stator 223 includes a coil 2231. The rotor 224 includes a magnet 2241. In the example of FIG. 6B, the motor 221 is an outer rotor type. That is, the rotor 224 is positioned radially outside the stator 223. For example, the impeller 122 is attached on the first direction other side X2 of the rotor 224. Therefore, the stator 223 and the rotor 224 are isolated from each other by the casing 225. That is, the stator 223 is isolated from the refrigerant RL. The rotating shaft 222 is positioned at the center of the pump chamber 123 and is rotatably supported by the casing 225 and an inner wall on the first direction other side X2 of the pump chamber 123.

The impeller 122 is disposed in the pump chamber 123. The impeller 122 is attached to the first direction other side X2 of the rotating shaft 222. The rotor 224 rotates by a magnetic action of the stator 223. As a result, the rotor 224 rotates about the rotating shaft 222 as a shaft center. The impeller 122 rotates in accordance with the rotation of the rotor 224. That is, the motor 221 rotates the impeller 122 about the rotating shaft 222.

By the rotation of the impeller 122, the refrigerant RL in the pump chamber 123 is pushed out and flows out from the pump outflow path 125 to the outside of the pump chamber 123. That is, the pump 121 discharges the refrigerant RL. With discharge of the refrigerant RL, the refrigerant RL is sucked from the pump inflow path 124 and flows into the pump chamber 123. In the present example embodiment, the pump outflow path 125 is connected to the pipe 41A or the pipe 41B.

Figure 6D:
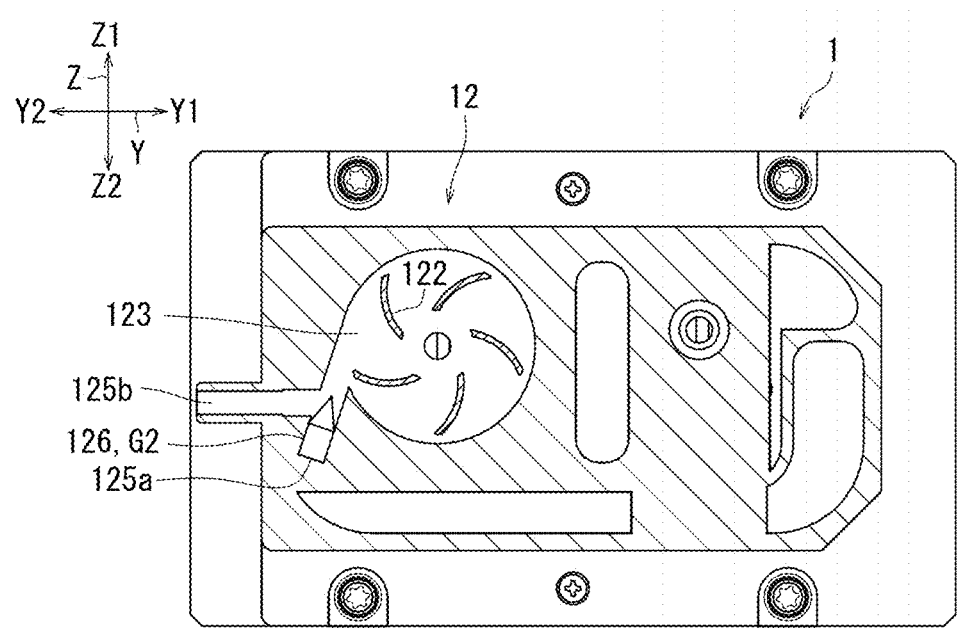
FIG. 6D is a sectional view showing inside of the pump section 12.
Figure 7:
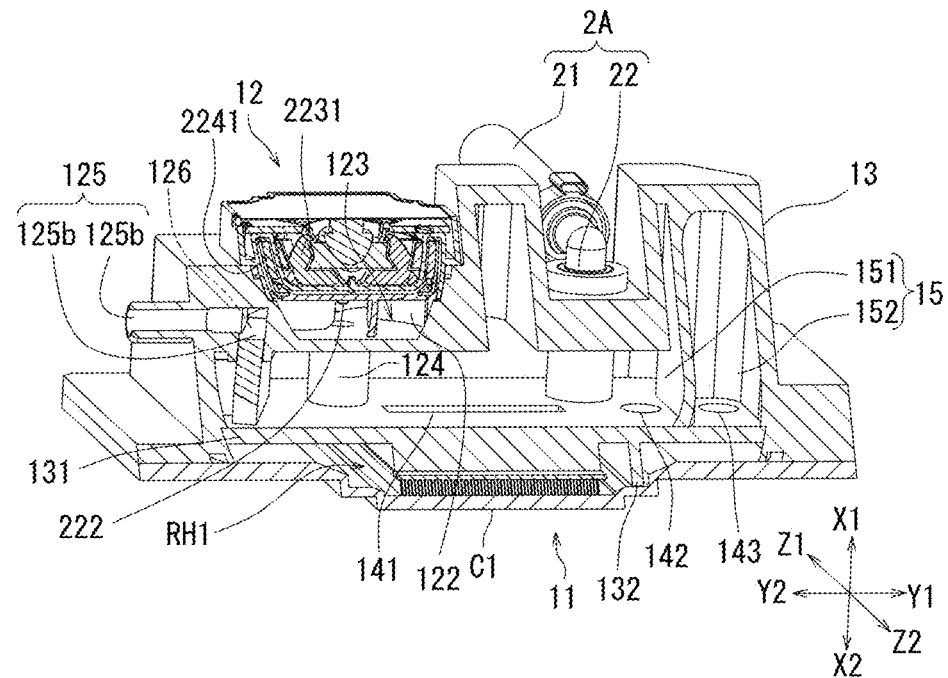
FIG. 7 is a sectional view of the cooling assembly.
Figure 8:
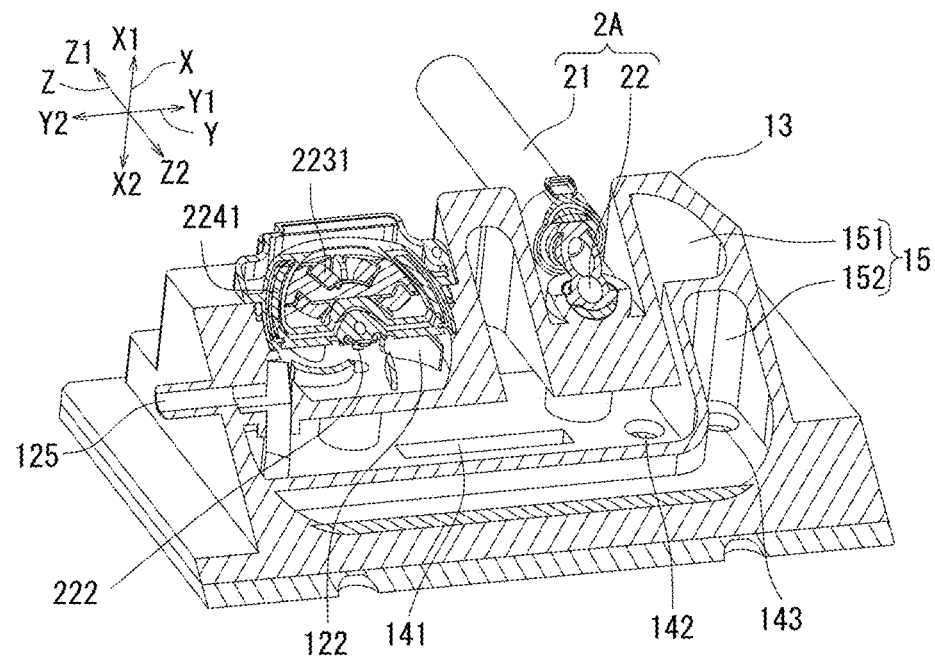
FIG. 8 is a sectional view of the cooling assembly.

Next, the pump outflow path 125 will be described with reference to FIGS. 6A to 7. FIGS. 6C and 6D are sectional views showing the inside of the pump section 12. FIG. 7 is a sectional view of the cooling assembly 1. FIGS. 6C and 6D are sectional views on a plane passing through the pump outflow path 125 and orthogonal to the first direction X. FIG. 7 shows a cut surface in which the cooling assembly 1 is cut in a direction inclined with respect to the first direction X.

The pump outflow path 125 is, for example, a tubular flow path. The pump outflow path 125 is disposed parallel to a plane orthogonal to the first direction X. Specifically, the pump outflow path 125 includes a first outflow path 125a and a second outflow path 125b.

The first outflow path 125a extends substantially parallel to the third direction other side Z2 from a part of the inner wall parallel to the first direction X of the pump chamber 123. One end of the first outflow path 125a is connected to a part of the inner wall parallel to the first direction X of the pump chamber 123.

The second outflow path 125b extends in parallel to the second direction other side Y2 from a position other than both ends of the first outflow path 125a. One end of the second outflow path 125b is connected to the first outflow path 125a. The other end of the second outflow path 125b is connected to the pipe 41A or the pipe 41B.

The check valve 126 is disposed in the pump outflow path 125. The check valve 126 blocks inflow of the refrigerant RL into the pump chamber 123 in a state where the pump 121 is stopped. Therefore, the check valve 126 can prevent the refrigerant RL from flowing back from the pump outflow path 125 via the connection section 2 to the pump chamber 123 of the pump 121 in the stopped state. As a result, the circulation direction of the refrigerant RL in the cooling system 100 can be limited to one direction.

Specifically, the check valve 126 is positioned at a connection position with the second outflow path 125b in the first outflow path 125a. The check valve 126 is movable along the first outflow path 125a. The position of the check valve 126 in the first outflow path 125a changes in accordance with the drive or stop of the pump 121. In a state where the pump 121 is stopped, the check valve 126 is positioned at a first position G1 and closes the first outflow path 125a and the second outflow path 125b.

On the other hand, in a state where the pump 121 is driven, the refrigerant RL is sent out to the pump outflow path 125. Due to pressure of the refrigerant RL having been sent out, the check valve 126 moves to a second position G2 positioned on the other end side of the first outflow path 125a relative to the first position G1. As a result, the first outflow path 125a and the second outflow path 125b are opened.

When the pump 121 being driven is stopped, the sending out of the refrigerant RL to the pump outflow path 125 is stopped. Therefore, the pressure of the refrigerant RL to be sent out is not applied to the check valve 126. As a result, the check valve 126 moves to the first position G1 by its own weight, for example.

The check valve 126 may be configured to be pressed toward one end side of the first outflow path 125a by an elastic member such as a spring. For example, the elastic member is disposed on the other end side of the first outflow path 125a relative to the check valve 126 inside the first outflow path 125a.

Next, a flow path from the pipe 32A or the pipe 32B to the first heat exchange chamber RH1 in the cooling assembly 1 will be described with reference to FIGS. 7 to 11. FIGS. 8 to 11 are each a sectional view of the cooling assembly 1. FIGS. 7 to 11 show cut surfaces in which the cooling assembly 1 is cut in different cross sections.

The accommodation section 13 includes a tank section 15. The tank section 15 accommodates the refrigerant RL. The tank section 15 is disposed on the first direction one side X1 relative to the first heat exchange chamber RH1 and the partition section 131 in the accommodation section 13. The partition section 131 includes a first through hole 141 that connects the tank section 15 and the first heat exchange chamber RH1. When circulating the refrigerant RL, temporarily storing the refrigerant RL in the tank section 15 prevents air from being carried in the first heat exchange chamber RH1 and being mixed into the pump chamber 123. As a result, the refrigerant RL smoothly circulates in the cooling system 101, thereby contributing to a long life of the pump 121.

For example, the cooling section 11 further includes a second heat exchange chamber RH2. The first heat exchange chamber RH1 is positioned on a downstream side relative to the second heat exchange chamber RH2 in the flow path of the refrigerant RL. The tank section 15 includes a first tank chamber 151 and a second tank chamber 152. The first tank chamber 151 is positioned between the second heat exchange chamber RH2 and the first heat exchange chamber RH1 in the flow path of the refrigerant RL. The second tank chamber 152 is positioned on an upstream side relative to the second heat exchange chamber RH2 in the flow path of the refrigerant RL. The partition section 131 further includes a second through hole 142 and a third through hole 143. The first through hole 141 connects the first tank chamber 151 and the first heat exchange chamber RH1. The second through hole 142 connects the second heat exchange chamber RH2 and the first tank chamber 151. The third through hole 143 connects the second tank chamber 152 and the second heat exchange chamber RH2.

Figure 10:
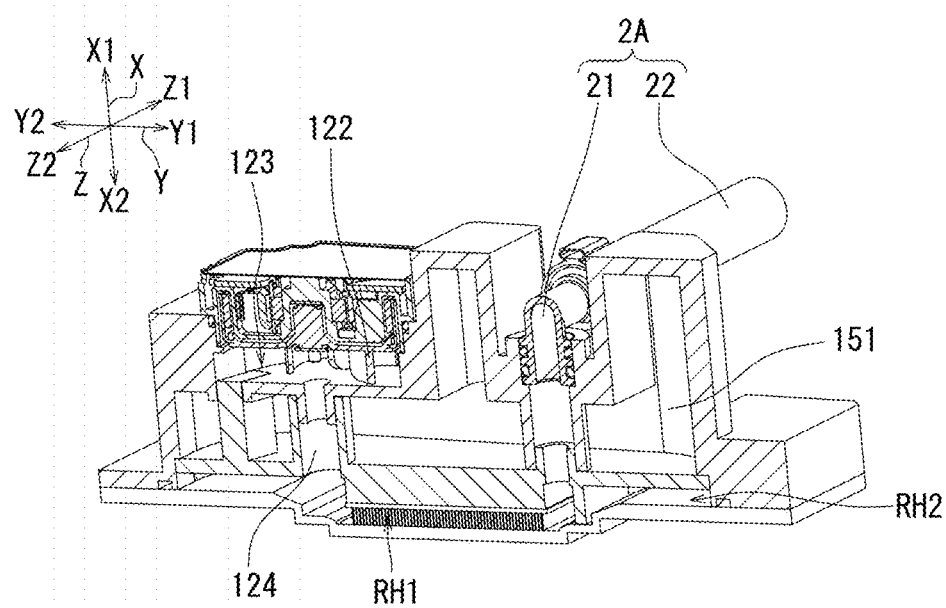
FIG. 10 is a sectional view of the cooling assembly.
Figure 11:
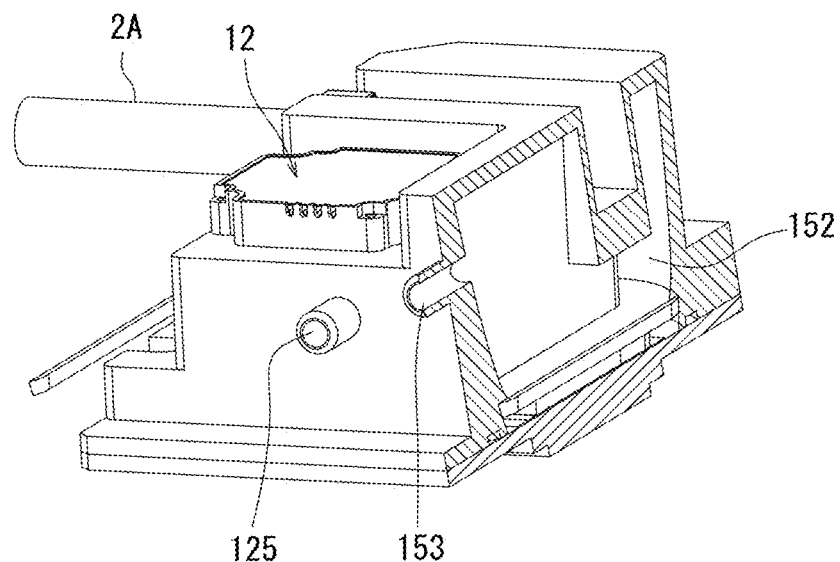
FIG. 11 is a sectional view of the cooling assembly.
Figure 11:
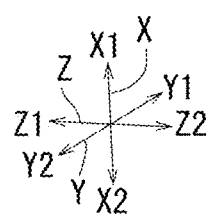

As shown in FIG. 10, the second tank chamber 152 includes an inlet 153. The inlet 153 is connected to the pipe 32A or the pipe 32B shown in FIG. 2. The refrigerant RL flows into the second tank chamber 152 from the pipe 32A or the pipe 32B via the inlet 153. The refrigerant RL having flowed into the second tank chamber 152 passes from the second tank chamber 152 to the first heat exchange chamber RH1 through the third through hole 143, the second heat exchange chamber RH2, the second through hole 142, the first tank chamber 151, and the first through hole 141 in this order. Therefore, an appropriate flow path for the refrigerant RL can be formed in the cooling assembly 1. Since heat exchange becomes possible in a plurality of heat exchange chambers, it becomes possible to cool a plurality of heat generating components.

Specifically, the partition section 131 includes a protrusion section 132 that protrudes from the surface on the first direction other side X2 toward the first direction other side X2 and extends in the third direction Z. The protrusion section 132 separates a space surrounded by the contact section 111 and the partition section 131 into the first heat exchange chamber RH1 and the second heat exchange chamber RH2. That is, the first heat exchange chamber RH1 and the second heat exchange chamber RH2 are adjacent to each other along the second direction Y.

The first heat exchange chamber RH1 is positioned on an axis extending from the heat generating component C1 toward the first direction one side X1. The first tank chamber 151 and the first through hole 141 are positioned on the axis extending from the heat generating component C1 toward the first direction one side X1. Therefore, the refrigerant RL can be efficiently delivered to the first heat exchange chamber RH1 in contact with the heat generating component C1.

The second through hole 142 is positioned away from the first through hole 141 on the second direction one side Y1. Therefore, the second through hole 142 is positioned on the first direction one side X1 of the second heat exchange chamber RH2. The third through hole 143 is positioned away from the second through hole 142 on the second direction one side Y1, and is positioned on the first direction one side X1 of the second heat exchange chamber RH2.

Next, the connection section 2A will be described in detail with reference to FIGS. 7 to 11. The connection section 2A includes an external connection pipe 21 and an internal connection pipe 22. In the cooling assembly 1, the internal connection pipe 22 extends from the first heat exchange chamber RH1 to the first direction one side X1 and penetrates the partition section 131 and the tank section 15. The external connection pipe 21 connects, outside the cooling assembly 1, the internal connection pipe 22 in the cooling assembly 1A and the internal connection pipe 22 in the cooling assembly 1B. Specifically, one end section of the internal connection pipe 22 is connected to the first heat exchange chamber RH1. The other end of the internal connection pipe 22 is connected to the external connection pipe 21.

As shown in FIG. 2, in the cooling device 10A, the cooling assembly 1A and the cooling assembly 1B are disposed along the third direction Z orthogonal to the first direction X. The external connection pipe 21 extends along the third direction Z. Therefore, the shape of the cooling assembly 1 and the orientation in which the cooling assembly 1 is disposed can be unified. As a result, the cooling device 10A can be made more compact.

Figure 9:
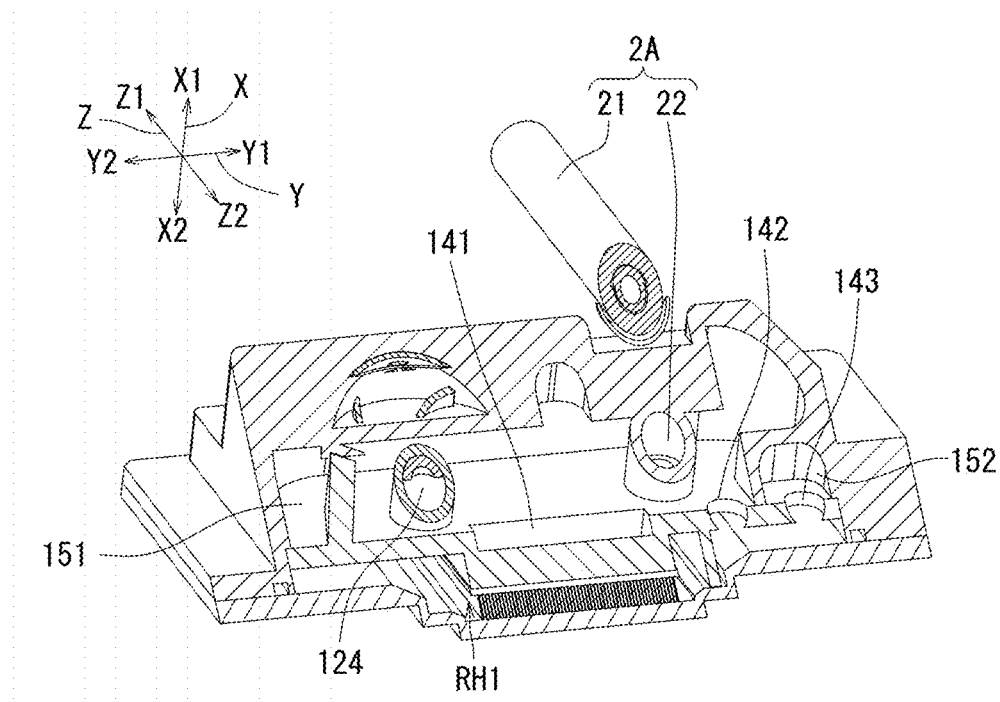
FIG. 9 is a sectional view of the cooling assembly.

As shown in FIGS. 9 and 10, the internal connection pipe 22 is positioned on the opposite side of the pump inflow path 124 across the first through hole 141. Specifically, the pump inflow path 124 is positioned on the second direction other side Y2 relative to the first through hole 141. The internal connection pipe 22 is positioned on the second direction one side Y1 relative to the first through hole 141.

Therefore, the refrigerant RL having reached the first heat exchange chamber RH1 through the first through hole 141 moves toward the pump inflow path 124 or the internal connection pipe 22. For example, in the cooling assembly 1A, when the pump 121 is driven, the refrigerant RL in the first heat exchange chamber RH1 moves to the second direction other side Y2 of the first heat exchange chamber RH1, and is sucked into the pump chamber 123 via the pump inflow path 124. As a result, it is possible to reduce inflow of the refrigerant RL into the pump chamber 123 of the pump section 12 that is stopped.

On the other hand, when the pump 121 of the cooling assembly 1A is stopped and the pump 121 of the cooling assembly 1B is driven, the refrigerant RL in the first heat exchange chamber RH1 of the cooling assembly 1A moves to the second direction one side Y1 of the first heat exchange chamber RH1, and reaches the first heat exchange chamber RH1 of the cooling assembly 1B via the internal connection pipe 22 of the cooling assembly 1A, the external connection pipe 21, and the internal connection pipe 22 of the cooling assembly 1B.

The refrigerant RL having reached the first heat exchange chamber RH1 of the cooling assembly 1B is sucked into the pump chamber 123 via the pump inflow path 124 by suction of the pump 121 of the cooling assembly 1B.

In a state where both the pump 121 of the cooling assembly 1A and the pump 121 of the cooling assembly 1B are driven, when the suction pressure of the pump 121 in the cooling assembly 1A and the suction pressure of the pump 121 in the cooling assembly 1B are made substantially equal, the refrigerant RL in the first heat exchange chamber RH1 does not move to the second direction one side Y1 of the first heat exchange chamber RH1, and does not pass through the internal connection pipe 22 of the cooling assembly 1A, the external connection pipe 21, and the internal connection pipe 22 of the cooling assembly 1B. The suction pressure indicates a pressure at which the pump 121 causes the refrigerant RL to flow into the pump chamber 123.

While the example in which the cooling section 11 and the pump section 12 are accommodated in one accommodation section 13 has been described above with reference to FIGS. 2 to 11, the cooling section 11 and the pump section 12 may be arranged apart from each other in the present example embodiment. In this case, for example, the cooling section 11 and the pump section 12 are connected by a pipe or the like. The pipe connecting the cooling section 11 and the pump section 12 is an example of the flow path section 20. The connection section 2 connects the pipe connecting one cooling section 11 and the pump section 12 and the pipe connecting the other cooling section 11 and the pump section 12.

In the present example embodiment, the cooling device 10A includes the first tank chamber 151 and the second tank chamber 152, but the present disclosure is not limited to this, and the cooling device 10A may include only one tank chamber. While the cooling device 10A includes the first heat exchange chamber RH1 and the second heat exchange chamber RH2, the present disclosure is not limited to this, and the cooling device 10A may include only one heat exchange chamber. In this case, the partition section 131 includes at least any one of the second through hole 142 and the third through hole 143.

Figure 12:
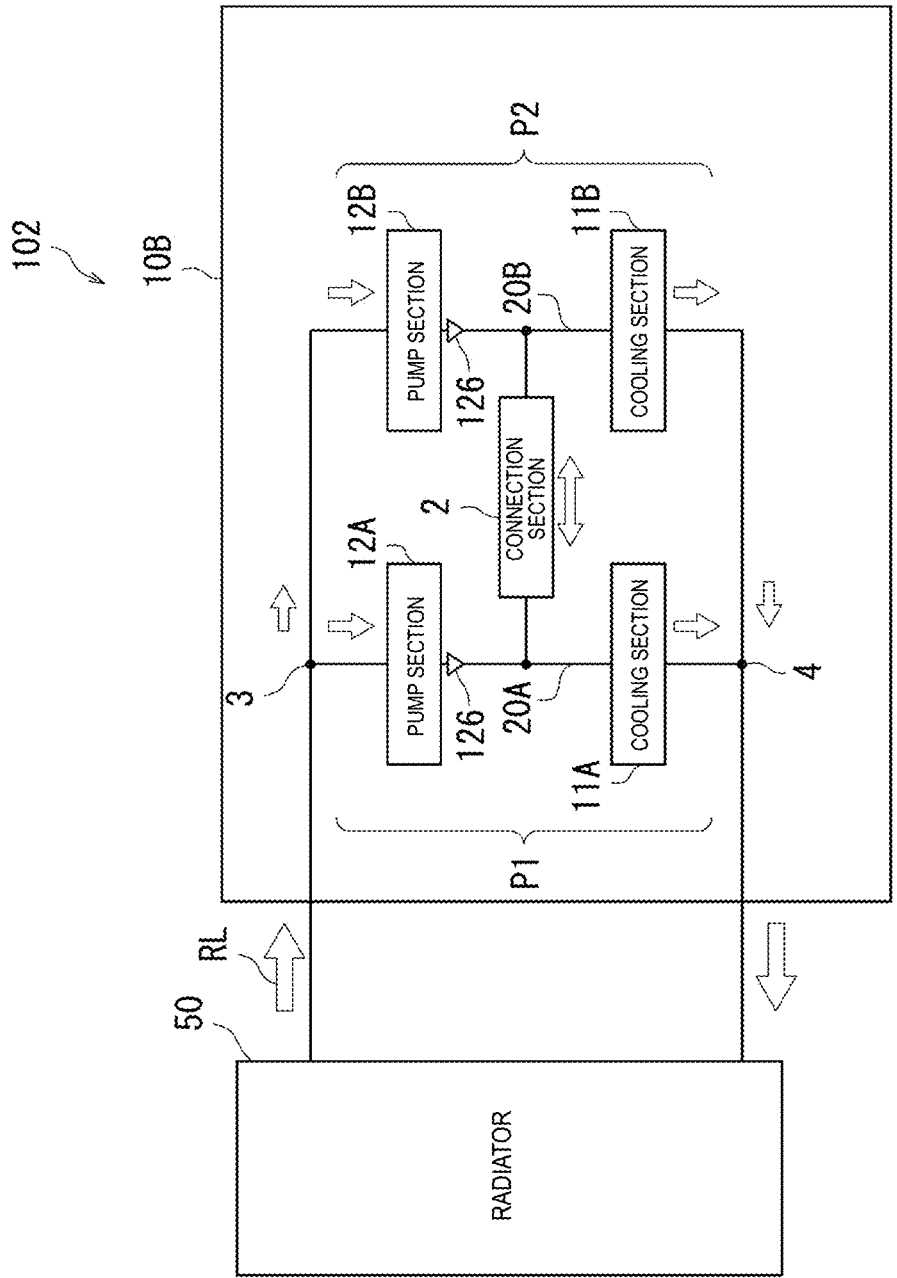
FIG. 12 is a view showing an outline of the cooling system.

Next, another example of the cooling system will be described with reference to FIG. 12. FIG. 12 is a view showing an outline of a cooling system 102. The cooling system 102 includes a cooling device 10B. The cooling system 102 has a circulation direction of the refrigerant RL that is opposite to that of the cooling system 100 shown in FIG. 1. In other words, the arrangement of the cooling section 11 and the pump section 12 in the cooling device 10B is opposite to that of the cooling device 10. For example, in the example of the cooling device 10A shown in FIGS. 5 and 6A, the pump inflow path 124 functions as an outflow path of the refrigerant RL from the pump chamber 123, and the pump outflow path 125 functions as an inflow path of the refrigerant RL into the pump chamber 123. In this case, a check valve is disposed in the pump inflow path 124.

Figure 13:
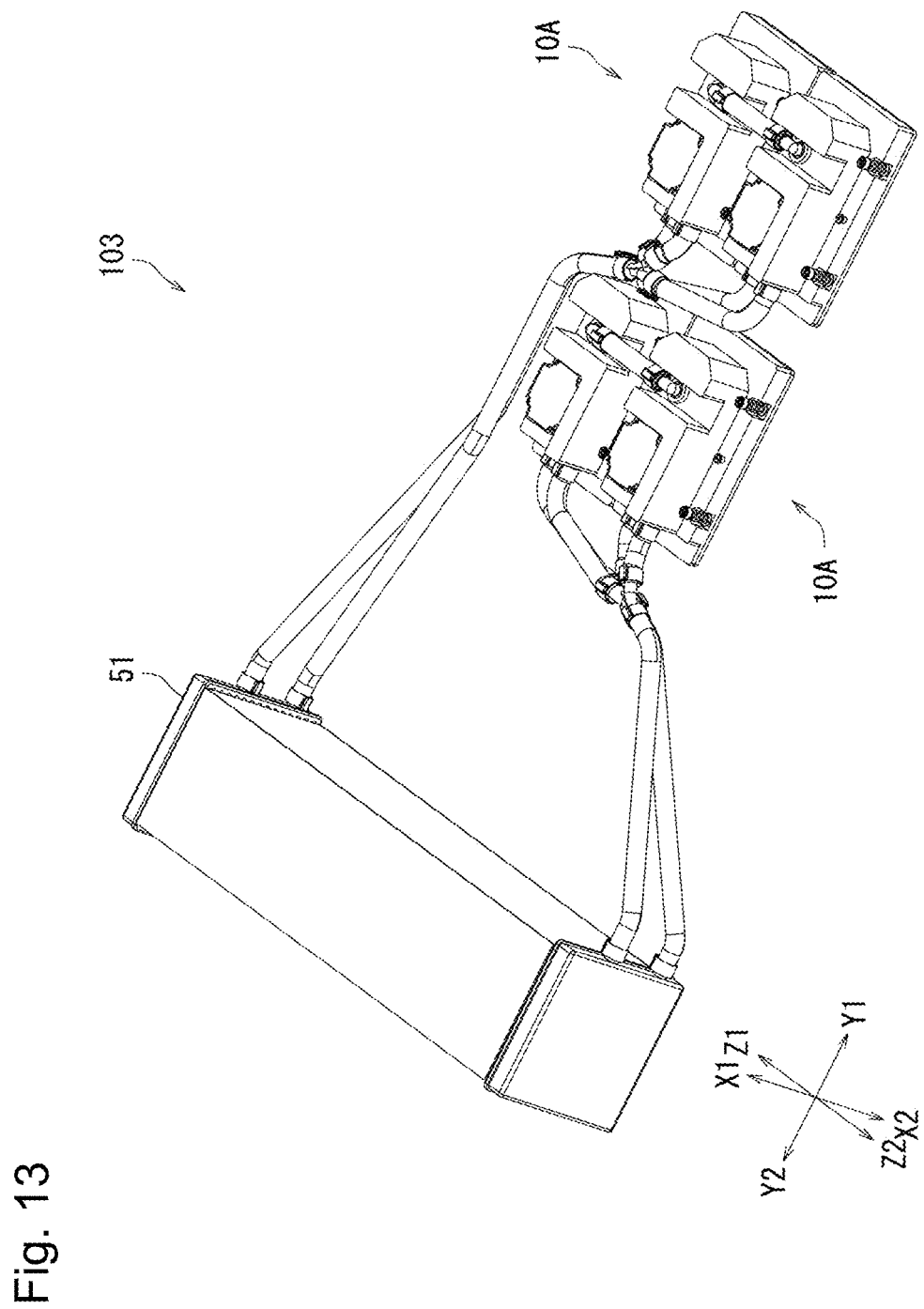
FIG. 13 is a view showing a cooling system including two cooling devices.

Next, an example of a cooling system including two cooling devices will be described with reference to FIG. 13. FIG. 13 is a view showing a cooling system 103 including two cooling devices 10A. The cooling system 103 includes the two cooling devices 10A and a heat exchanger 51. The heat exchanger 51 is connected to the two cooling devices 10A. In the cooling system 103, the refrigerant RL circulating in one cooling device 10A and the refrigerant RL circulating in the other cooling device 10A are separated inside the heat exchanger 51.

Figure 14:
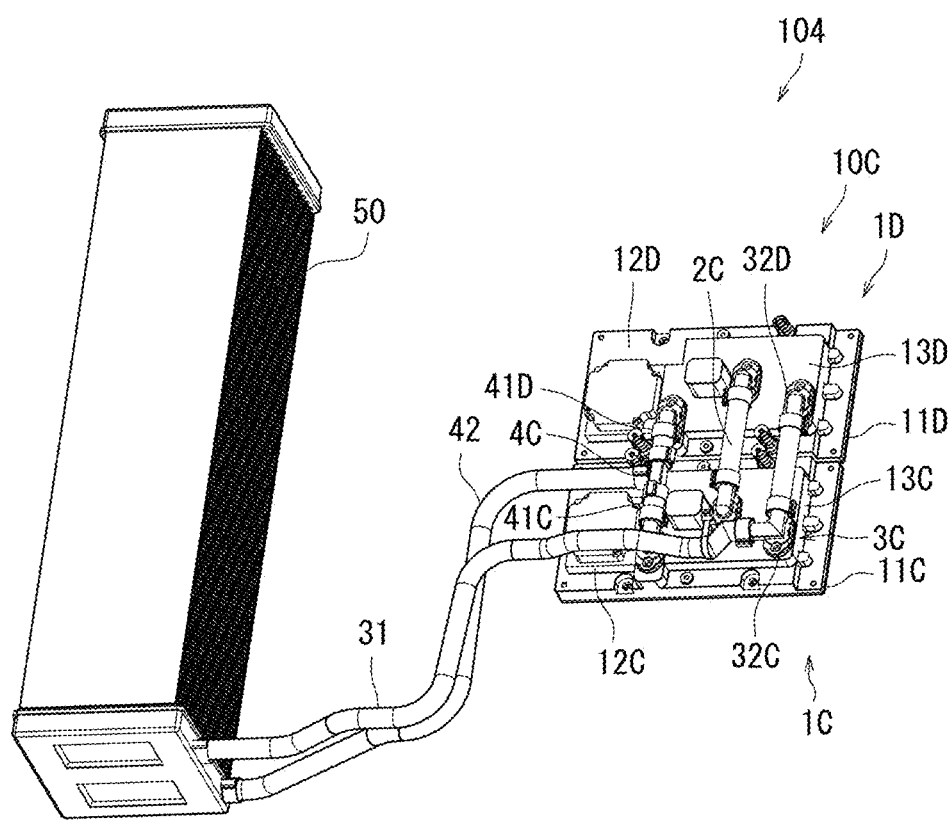
FIG. 14 is a view showing the cooling system.

Next, another example of the cooling system will be described with reference to FIG. 14. FIG. 14 is a view showing a cooling system 104. The cooling system 104 includes a cooling device 10C, the pipe 31, the pipe 42, and the heat exchanger 50. The pipe 31, the pipe 42, and the heat exchanger 50 are the same as the pipe 31, the pipe 42, and the heat exchanger 50 of the cooling system 101 shown in FIG. 2.

As compared with the cooling device 10A shown in FIG. 2, the cooling device 10C includes a cooling assembly 1C instead of the cooling assembly 1A. The cooling device 10C includes a cooling assembly 1D instead of the cooling assembly 1B. The cooling device 10C includes a connection section 2C instead of the connection section 2A. The cooling device 10C includes a branch section 3C instead of the branch section 3A. The cooling device 10C includes a merging section 4C instead of the merging section 4A. The branch section 3C is connected to the cooling assembly 1C via a pipe 32C, and is connected to the cooling assembly 1D via a pipe 32D. The merging section 4C is connected to the cooling assembly 1C and the cooling assembly 1D.

Figure 15:
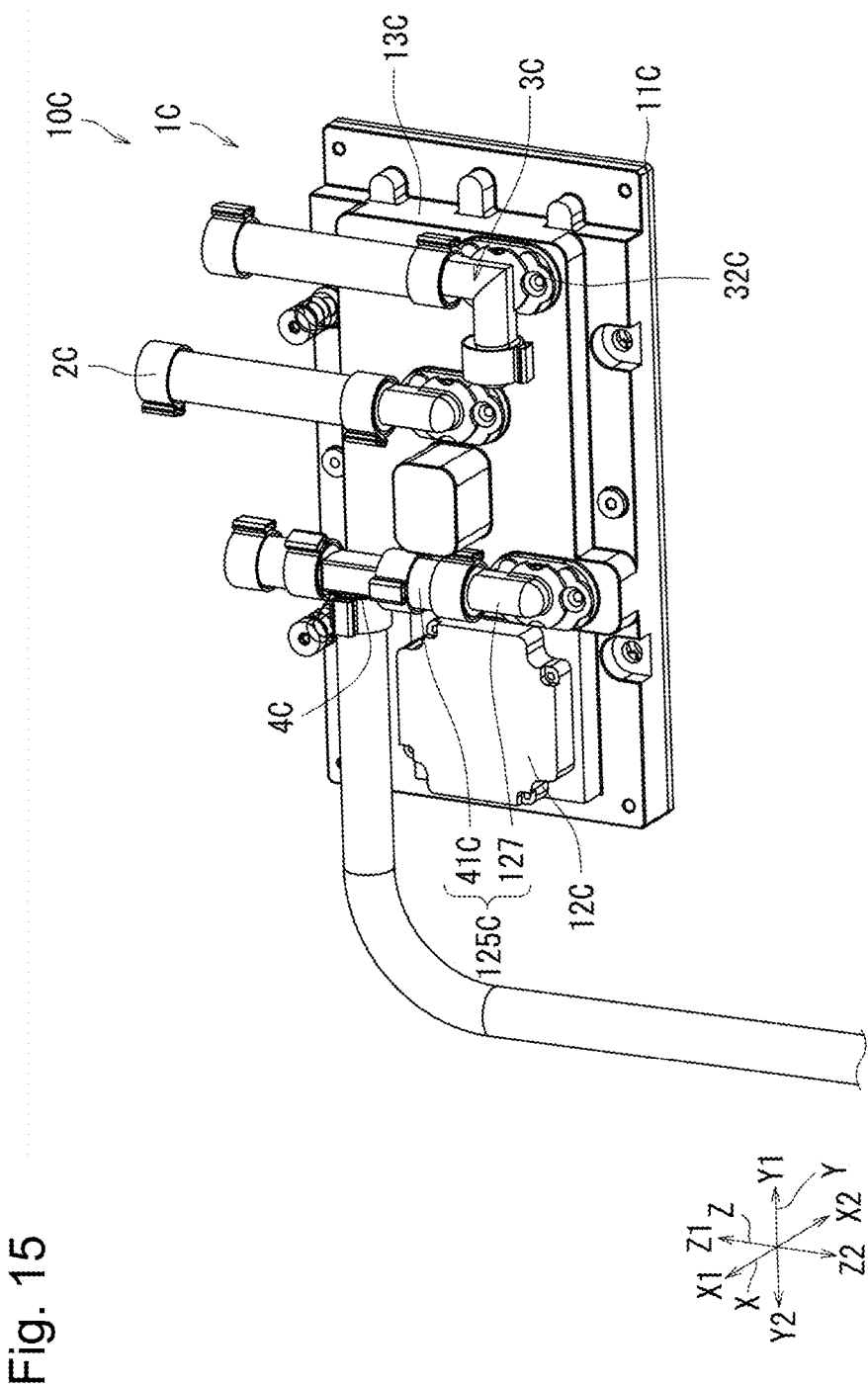
FIG. 15 is a view showing the cooling assembly.

Next, the cooling assembly 1C will be described with reference to FIGS. 14 and 15. FIG. 15 is a view showing the cooling assembly 1C. The cooling assembly 1C includes a cooling section 11C, a pump section 12C, and an accommodation section 13C. The cooling assembly 1D includes a cooling section 11D, a pump section 12D, and an accommodation section 13D. Since the cooling assembly 1C and the cooling assembly 1D have the same configuration similarly to the cooling assembly 1A and the cooling assembly 1B shown in FIG. 2, the cooling assembly 1C will be described below as an example.

The cooling section 11C has the same configuration as and a different shape from the cooling section 11 shown in FIGS. 3 to 6D. The pump section 12C has the same configuration as and a different shape from the pump section 12 shown in FIGS. 3 to 6D. The accommodation section 13C has the same configuration as and a different shape from the accommodation section 13 shown in FIGS. 3 to 6D.

Therefore, the arrangement of the pipe 32C and a pipe 41C in the cooling assembly 1C is different from the arrangement of the pipe 32A and the pipe 41A in the cooling assembly 1A. The arrangement of the pipe 32D and the pipe 41D in the cooling assembly 1D is different from the arrangement of the pipe 32B and the pipe 41B in the cooling assembly 1B. The arrangement of the connection section 2C in the cooling device 10C is different from the arrangement of the connection section 2A in the cooling device 10A.

Figure 16:
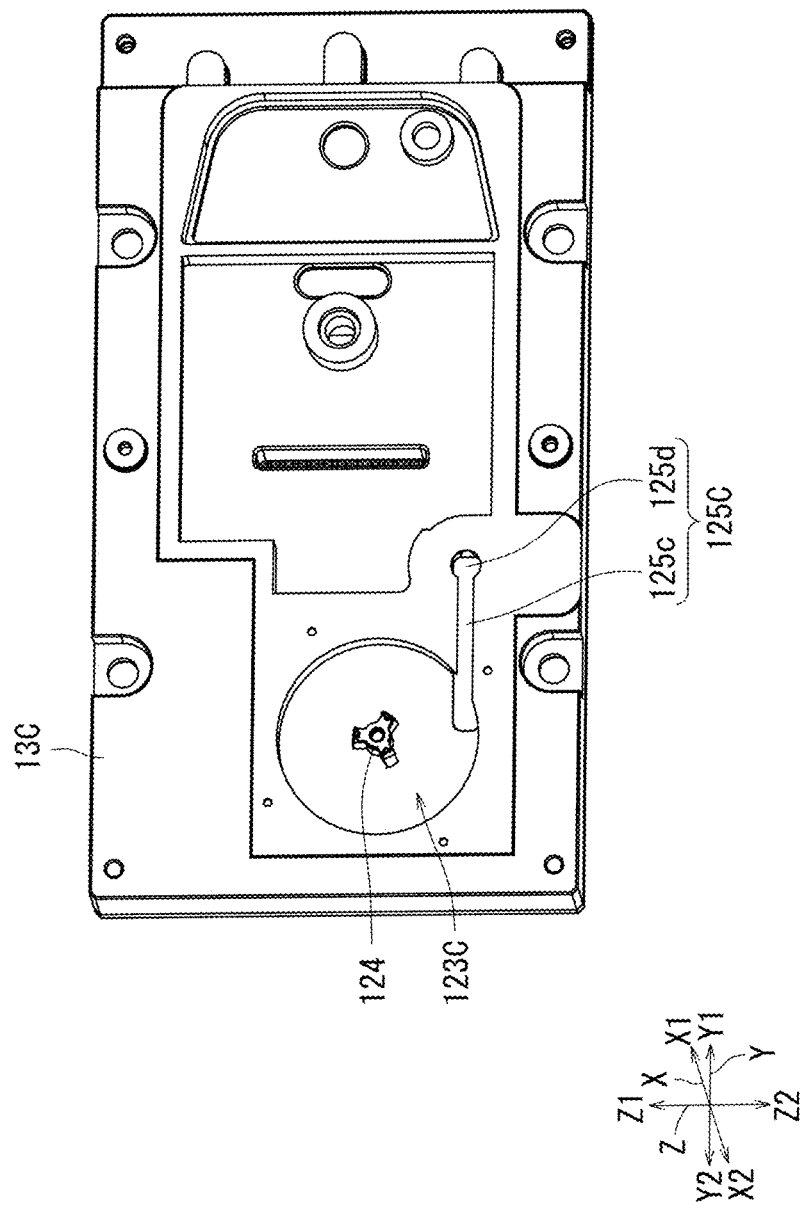
FIG. 16 is a sectional view showing inside of the pump section and an accommodation section.

Next, the pump section 12C and the accommodation section 13C will be described with reference to FIGS. 13 to 16. FIG. 16 is a sectional view showing the inside of the pump section and the accommodation section. FIG. 16 is a sectional view taken along a plane passing through a pump outflow path 125C and orthogonal to the first direction X.

The pump section 12C includes the pump 121 shown in FIG. 6A and the pump inflow path 124 shown in FIG. 6A. The pump section 12C includes a pump chamber 123C and the pump outflow path 125C. The pump chamber 123C is different in shape from pump chamber 123 shown in FIG. 6A. The pump outflow path 125C is different in configuration and shape from the pump outflow path 125 shown in FIGS. 6C and 6D.

Specifically, the pump outflow path 125C includes a first outflow path 125$c$, a second outflow path 125$d$, and a guide section 127. The guide section 127 guides the refrigerant RL to the outside of the accommodation section 13C. The first outflow path 125$c$ and the second outflow path 125$d$ connect the pump chamber 123C and the guide section 127. The first outflow path 125$c$ and the second outflow path 125$d$ are examples of a connection path. The pump outflow path 125C is connected to the merging section 4C.

The first outflow path 125$c$ extends substantially parallel to the second direction one side Y1 from a part of the inner wall parallel to the first direction X of the pump chamber 123C. One end of the first outflow path 125$c$ is connected to a part of the inner wall parallel to the first direction X of the pump chamber 123C. In the present example embodiment, the inner wall of the first outflow path 125$c$ includes the partition section and the accommodation section 13C. That is, the inner wall of the first outflow path 125$c$ includes a plurality of members.

The second outflow path 125$d$ extends parallel to the first direction one side X1 from the other end of the first outflow path 125$c$. That is, one end of the second outflow path 125$d$ is connected to the first outflow path 125$c$. The other end of the second outflow path 125$d$ is connected to the guide section 127 shown in FIG. 15. In the present example embodiment, the inner wall of the second outflow path 125$d$ includes the accommodation section 13C. That is, the inner wall of the second outflow path 125$d$ includes a single portion. The second outflow path 125$d$ is an example of a connection portion between the connection path and the guide section.

The guide section 127 extends from the inside to the outside of the accommodation section 13C. Specifically, the guide section 127 extends parallel to the first direction one side X1, bends substantially at a right angle with respect to the first direction X, and extends, for example, to the third direction one side Z1. One end of the guide section 127 is connected to the other end of the second outflow path 125*d*. The other end of the guide section 127 is connected to the merging section 4C. For example, the guide section 127 includes an L-shaped pipe and the pipe 41C. The pipe 41C connects the L-shaped pipe and the merging section 4C. For example, the guide section 127 is detachable from the accommodation section 13C.

Figure 17:
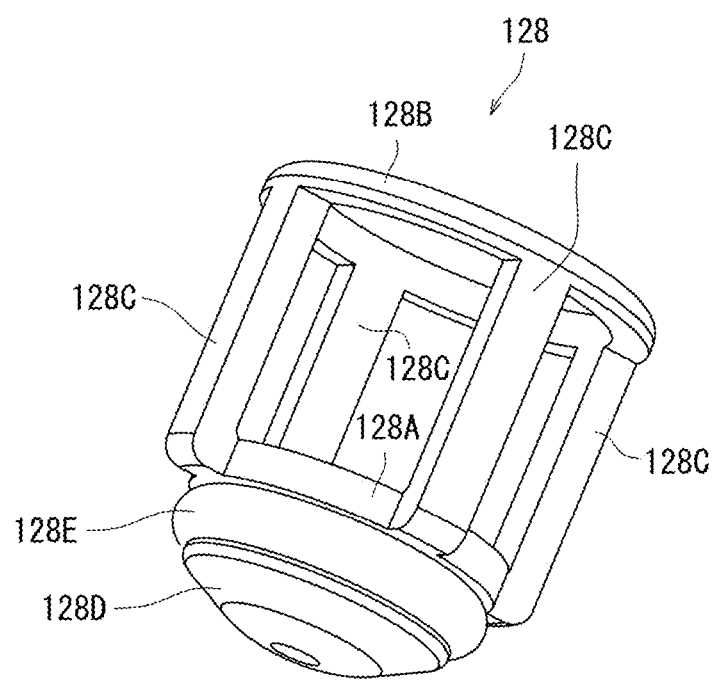
FIG. 17 is a view showing a check valve of the cooling device.
Figure 18:
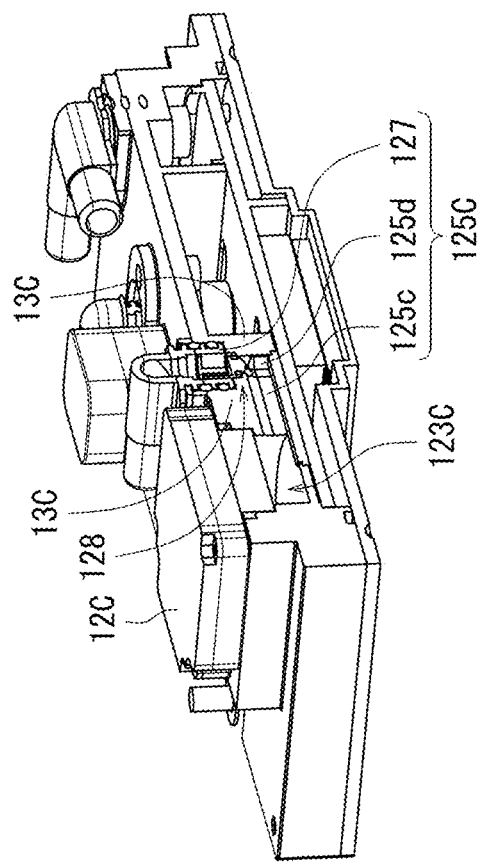
FIG. 18 is a sectional view showing inside of a guide section, the check valve, and the accommodation section.

Next, the guide section 127 and a check valve 128 of the cooling device 10C will be described with reference to FIGS. 17 and 18. FIG. 17 is a view showing a check valve of the cooling device. FIG. 18 is a sectional view showing the inside of the guide section, the check valve, and the accommodation section.

As shown in FIG. 18, the pump section 12C includes the check valve 128. The check valve 128 is disposed on the guide section 127, for example.

As shown in FIG. 17, the check valve 128 includes a plate-like section 128A, a ring section 128B, four columnar sections 128C, and a sealing section 128D. For example, the ring section 128B is an annular member. The outer diameter of the ring section 128B is substantially the same as the inner diameter of the guide section 127. For example, the plate-like section 128A is a disk. The outer diameter of the plate-like section 128A is smaller than the outer diameter of the ring section 128B. That is, the outer diameter of the plate-like section 128A is smaller than the inner diameter of the guide section 127. The four columnar sections 128C couple an outer edge of the plate-like section 128A and a surface on the plate-like section 128A side of the ring section 128B. The sealing section 128D is disposed on the plate-like section 128A. The sealing section 128D is positioned on the opposite side of the ring section 128B in the plate-like section 128A. For example, the sealing section 128D has a substantially conical shape or a substantially hemispherical shape having the plate-like section 128A as a bottom surface. The plate-like section 128A and the ring section 128B are only required to have a shape that is not limited to a circular shape but conforming to the shape of the inside of the guide section.

The sealing section 128D includes a seal 128E. The seal 128E is, for example, an O-ring, a packing, a gasket, or the like. In the example shown in FIG. 18, the seal 128E is an O-ring. The seal 128E is disposed on the surface of the sealing section 128D. The outer diameter of the O-ring is, for example, substantially the same as the width of the flow path of the refrigerant RL sealed by the sealing section 128D. By disposing the seal 128E in the sealing section 128D, it is possible to more reliably close the flow path of the refrigerant RL.

Figure 19:
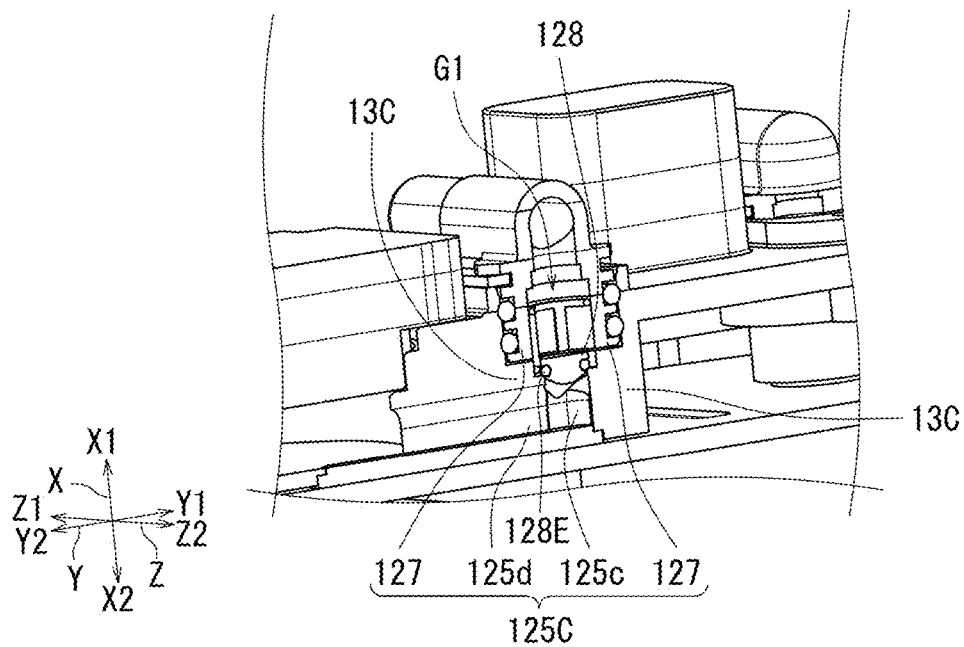
FIG. 19 is an enlarged view of the guide section in FIG. 18, the check valve, a first outflow path, and a second outflow path.
Figure 20:
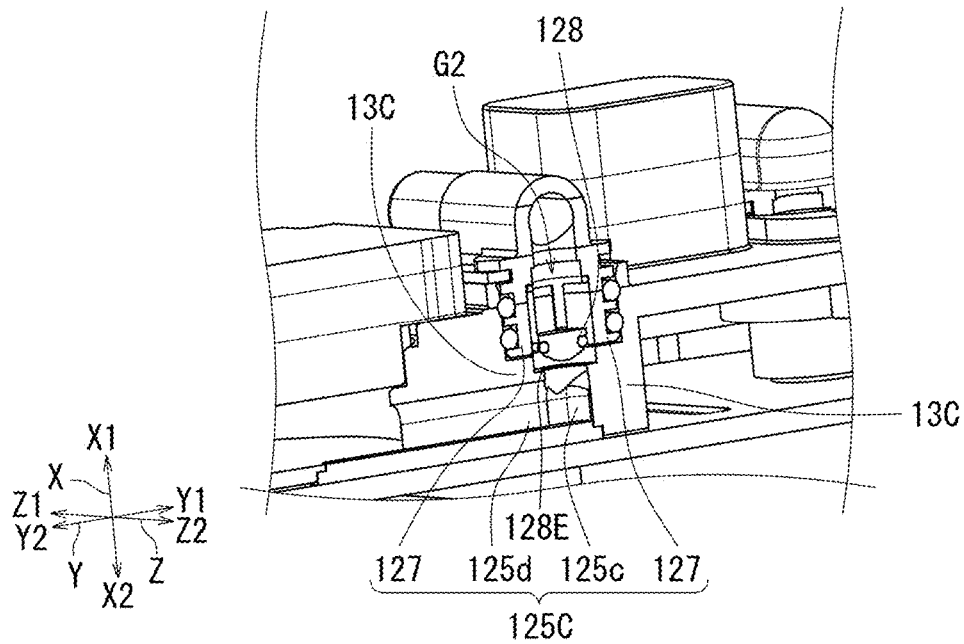
FIG. 20 is an enlarged view of the guide section in FIG. 18, the check valve, the first outflow path, and the second outflow path.

Next, sealing of the flow path of the refrigerant RL by the check valve 128 will be described with reference to FIGS. 19 and 20. FIGS. 19 and 20 are enlarged views of the guide section, the check valve, the first outflow path, and the second outflow path in FIG. 18. FIG. 19 shows a case where the check valve 128 is positioned at the first position G1. FIG. 20 shows a case where the check valve 128 is positioned at the second position G2.

The check valve 128 moves along the first direction X between the first position G1 and the second position G2 in the guide section 127. The second position G2 is positioned on the first direction one side X1 relative to the first position G1. Since the principle of movement of the check valve 128 is the same as that of the check valve 126, the description will be omitted.

When the check valve 128 is positioned at the first position G1, the seal 128E of the sealing section 128D comes into contact with at least a part of the pump outflow path 125C. Specifically, the seal 128E comes into contact with the inner wall of the second outflow path 125*d* at the first position G1. By the seal 128E coming into contact with the inner wall of the second outflow path 125*d*, the pump outflow path 125C is sealed.

On the other hand, when the check valve 128 is positioned at the second position G2, the seal 128E of the sealing section 128D does not come into contact with the pump outflow path 125C. Therefore, the pump outflow path 125C is opened. As described above, the sealing section 128D can come into contact with a single portion. By the sealing section 128D coming into contact with the single portion, an individual difference, a manufacturing error, or the like in the flow path of the refrigerant RL can be absorbed, and the flow path of the refrigerant RL can be closed more reliably. By disposing the check valve 128 in the pump outflow path 125C, it is possible to more efficiently prevent backflow of the refrigerant RL into the pump chamber 123C. In particular, disposing the check valve 128 in the guide section 127 allows the seal 128E and the inner wall of the second outflow path 125*d* to be more easily brought into contact with each other.

Furthermore, by making the moving direction of the check valve 128 the first direction X, the extending direction of the second outflow path 125*d* or the opening direction of the other end of the second outflow path 125*d* becomes the first direction X. Therefore, in the accommodation section 13C manufactured by resin molding, the second outflow path 125*d* can be more easily molded.

In the present example embodiment, the inner wall of the first outflow path 125*c* includes a plurality of members, but the present disclosure is not limited to this, and the inner wall of the first outflow path 125*c* may include a single portion. For example, the inner wall of the first outflow path 125*c* may include the accommodation section 13C. That is, both the inner wall of the first outflow path 125*c* and the inner wall of the second outflow path 125*d* may include the accommodation section 13C.

In the present example embodiment, the sealing section 128D needs not have the seal 128E. In this case, the inner wall of the flow path of the refrigerant RL is sealed by the surface of the sealing section 128D coming into contact with the inner wall of the flow path of the refrigerant RL.

In the present example embodiment, the check valve 128 is disposed in the guide section 127, but the present disclosure is not limited to this, and the check valve 128 may be disposed in, for example, the first outflow path 125*c*, the second outflow path 125*d*, or the pipe 41C. In this case, the moving direction of the check valve 128 is not limited to the first direction X. Specifically, the check valve 128 moves along the direction in which the first outflow path 125*c*, the second outflow path 125*d*, or the pipe 41C extends.

The example embodiment of the present disclosure has been described above with reference to the drawings (FIGS. 1 to 20). However, the present disclosure is not limited to the above example embodiment, and can be implemented in various modes without departing from the gist of the present disclosure. Additionally, the plurality of components disclosed in the above example embodiment can be appropriately modified. For example, a certain component of all components shown in a certain example embodiment may be added to a component of another example embodiment, or some components of all components shown in a certain example embodiment may be removed from the example embodiment.

The drawings schematically show mainly each component in order to facilitate understanding of the disclosure, and each illustrated component may be different in thickness, length, number, interval, or the like from actual one for convenience of creating the drawings. The configuration of each component shown in the above example embodiment is an example and is not particularly limited, and it goes without saying that various modifications can be made without substantially departing from the effects of the present disclosure.

The present disclosure is applicable to the field of cooling systems.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling device comprising:
a first cooling section;
a second cooling section;
a first pump section;
a second pump section;
a branch section to branch a refrigerant into two;
a first flow path section that connects the first cooling section and the first pump section, and through which one portion of the refrigerant that has been branched passes;
a second flow path section that connects the second cooling section and the second pump section, and through which another portion of the refrigerant that has been branched passes;
a merging section to merge the refrigerant having passed through each of the first flow path section and the second flow path section; and
a connection section to fluidly connect the first flow path section and the second flow path section between the branch section and the merging section.

2. The cooling device according to claim 1, wherein
the first pump section includes:
a first pump to circulate the refrigerant;
a first pump chamber in which the first pump is located;
a first pump inflow path through which the refrigerant flows into the first pump chamber;
a first pump outflow path through which the refrigerant flows out of the first pump chamber; and
a first check valve located in the first pump outflow path;
the first check valve blocks inflow of the refrigerant into the first pump chamber in a state where the first pump is stopped;
the second pump section includes:
a second pump to circulate the refrigerant;
a second pump chamber in which the second pump is located;
a second pump inflow path through which the refrigerant flows into the second pump chamber;
a second pump outflow path through which the refrigerant flows out of the second pump chamber; and
a second check valve located in the second pump outflow path; and
the second check valve blocks inflow of the refrigerant into the second pump chamber in a state where the second pump is stopped.

3. The cooling device according to claim 2, wherein in a state where the first pump is driven and the second pump is driven, suction pressure of the first pump when causing the refrigerant to flow into the first pump chamber is equal or substantially equal to suction pressure of the second pump when causing the refrigerant to flow into the second pump chamber.

4. The cooling device according to claim 2, further comprising:
two cooling assemblies; wherein
each of the two cooling assemblies includes:
one of the first pump section and the second pump section;
one of the first cooling section and the second cooling section;
one of the first flow path section and the second flow path section; and
an accommodation section that connects the one of the first pump section and the second pump section and the one of the first cooling section and the second cooling section;
the accommodation section includes:
the one of the first flow path section and the second flow path section; and
a partition section that partitions the one of the first pump section and the second pump section and the one of the first cooling section and the second cooling section;
the one of the first cooling section and the second cooling section includes:
a contact section that comes into contact with a heat generating component; and
a first heat exchange chamber in which heat of the heat generating component is exchanged via the contact section;
the partition section is positioned on one side of the first heat exchange chamber in a first direction;
the contact section is positioned on another side of the first heat exchange chamber in the first direction;
one pump inflow path of the first pump inflow path and the second pump inflow path or one pump outflow path of the first pump outflow path and the second pump outflow path penetrates the partition section to connect the first heat exchange chamber and one pump chamber of the first pump chamber and the second pump chamber; and
the connection section connects the first heat exchange chamber in one of the cooling assemblies and the first heat exchange chamber in another of the cooling assemblies.

5. The cooling device according to claim 4, wherein
the accommodation section further includes a tank section that accommodates the refrigerant;
the tank section is located on the first direction one side relative to the first heat exchange chamber and the partition section in the accommodation section; and
the partition section includes a first through hole that connects the tank section and the first heat exchange chamber.

6. The cooling device according to claim 5, wherein
the connection section includes:
an internal connection pipe that extends from the first heat exchange chamber to one side of the first direction and penetrates the partition section and the tank section in each of the cooling assemblies; and an external connection pipe that connects the internal connection pipe in each of the cooling assemblies outside the cooling assemblies; and the two cooling assemblies are located along a direction orthogonal to the first direction.

7. The cooling device according to claim 5, wherein the cooling section further includes a second heat exchange chamber;

the first heat exchange chamber is positioned on a downstream side relative to the second heat exchange chamber;

the tank section includes:
- a first tank chamber positioned between the second heat exchange chamber and the first heat exchange chamber; and
- a second tank chamber positioned on an upstream side relative to the second heat exchange chamber;

the partition section includes:
- a second through hole that connects the second heat exchange chamber and the first tank chamber; and
- a third through hole that connects the second tank chamber and the second heat exchange chamber; and the first through hole connects the first tank chamber and the first heat exchange chamber.

8. The cooling device according to claim 4, wherein at least one of the first check valve and the second check valve includes a sealing section that comes into contact with a single portion.

9. The cooling device according to claim 8, wherein the pump outflow path includes the single portion; and the sealing section comes into contact with at least a portion of the pump outflow path to seal the pump outflow path.

10. The cooling device according to claim 9, wherein the pump outflow path is connected to the merging section;

the pump outflow path includes:
- a guide section that guides the refrigerant to an outside of the accommodation section; and
- a connection path that connects the pump chamber and the guide section; and the check valve is located on the guide section.

11. The cooling device according to claim 10, wherein an inner wall of the connection path includes a single portion at a connection portion between the connection path and the guide section;

the check valve moves along a first direction between a first position in the guide section and a second position that is positioned on one side of a first direction relative to the first position; and the sealing section comes into contact with the inner wall of the connection path at the first position in the guide section.

12. The cooling device according to claim 8, wherein the sealing section includes a seal.

* * * * *